US009397146B2

(12) United States Patent
Toh et al.

(10) Patent No.: US 9,397,146 B2
(45) Date of Patent: Jul. 19, 2016

(54) VERTICAL RANDOM ACCESS MEMORY WITH SELECTORS

(71) Applicant: GLOBALFOUNDRIES Singapore Pte. Ltd., Singapore (SG)

(72) Inventors: Eng Huat Toh, Singapore (SG); Yuan Sun, Singapore (SG); Elgin Kiok Boone Quek, Singapore (SG); Shyue Seng Tan, Singapore (SG); Xuan Anh Tran, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/277,808

(22) Filed: May 15, 2014

(65) Prior Publication Data

US 2015/0333103 A1 Nov. 19, 2015

(51) Int. Cl.
*H01L 27/24* (2006.01)
*H01L 27/06* (2006.01)

(52) U.S. Cl.
CPC .......... *H01L 27/249* (2013.01); *H01L 27/2409* (2013.01); *H01L 27/2445* (2013.01); *H01L 27/0688* (2013.01)

(58) Field of Classification Search
CPC .............. H01L 27/2481; H01L 27/249; H01L 45/1233; G11C 2213/71; G11C 2213/72; G11C 2213/73
USPC ........................................ 257/1–5
See application file for complete search history.

(56) References Cited

U.S. PATENT DOCUMENTS

| | | | | |
|---|---|---|---|---|
| 6,605,845 B1* | 8/2003 | Liang | .................. | H01L 21/2815 257/368 |
| 8,124,968 B2* | 2/2012 | Koo | ...................... | H01L 27/101 257/4 |
| 2011/0300686 A1* | 12/2011 | Chae | .................. | H01L 27/0688 438/382 |
| 2013/0200327 A1* | 8/2013 | Wang | ..................... | H01L 45/04 257/4 |

* cited by examiner

*Primary Examiner* — Matthew W Such
*Assistant Examiner* — David Spalla
(74) *Attorney, Agent, or Firm* — Horizon IP Pte. Ltd.

(57) ABSTRACT

Devices and methods for manufacturing a device are presented. The device includes a substrate and a vertical structure disposed over the substrate. The vertical structure includes one or more memory cell stacks with a dielectric layer between every two adjacent cell stacks. Each of the one or more cell stacks includes first and second first type conductors on first and second sides of the cell stack, respectively; first and second electrodes, the first electrode adjacent the first first type conductor, the second electrode adjacent the second first type conductor; and first and second memory elements, the first memory element disposed between the first first type conductor and the first electrode, the second memory element disposed between the second first type conductor and the second electrode. The device also includes a selector element disposed over the substrate and vertically traversing through a middle portion of the vertical structure. The selector element includes respective first and second selector diodes for the first and second memory elements of each of the one or more cell stacks.

20 Claims, 30 Drawing Sheets

US 9,397,146 B2

VERTICAL RANDOM ACCESS MEMORY WITH SELECTORS

BACKGROUND

Non-volatile memory (NVM) devices are in general memory devices that retain, or store, data even when not powered. Presently, NVM devices are utilized in a wide range of applications including, for example, smart cards, microcontrollers (MCU), mobile phones, digital cameras, memory cards, and other applications where power is not always available, power is frequently interrupted, or lower power usage is required. Typical NVM devices include, for example, Erasable and Programmable Read Only Memory (EPROM) devices, Electrically Erasable and Programmable Read Only Memory (EEPROM) devices and flash memory.

Random access memory (RAM) device, such as resistive RAM (ReRAM or RRAM), is a type of NVM device. RAM devices tend to use lower energy consumption with increased performance when compared to conventional memory devices. RAM devices may have a cross-point cell configuration in which parallel bit lines are crossed by perpendicular word lines with the switching material placed between word line and bit line at every cross point. This architecture, however, can lead to a large "sneak" parasitic current flowing through non-selected memory cells via neighboring cells, which may result in incorrect reading of the selected cell or undesired writing to unselected cells.

Accordingly, there is a need for a new design of memory cells of RAM devices, and a manufacturing method thereof, to address and avoids the issue of sneak path.

SUMMARY

Embodiments generally relate to vertical RAM devices with selectors and a manufacturing method thereof. In one embodiment, a device is disclosed. The device includes a substrate and a vertical structure disposed over the substrate. The vertical structure includes one or more memory cell stacks with a dielectric layer between every two adjacent cell stacks. Each of the one or more cell stacks includes first and second first type conductors on first and second sides of the cell stack, respectively; first and second electrodes, the first electrode adjacent the first first type conductor, the second electrode adjacent the second first type conductor; and first and second memory elements, the first memory element disposed between the first first type conductor and the first electrode, the second memory element disposed between the second first type conductor and the second electrode. The device also includes a selector element disposed over the substrate and vertically traversing through a middle portion of the vertical structure. The selector element includes respective first and second selector diodes for the first and second memory elements of each of the one or more cell stacks.

In another embodiment, a device is presented. The device includes a substrate and a vertical structure disposed over the substrate. The vertical structure includes one or more selector element stacks with a dielectric layer between every two adjacent selector element stacks. Each of the one or more selector element stacks includes first and second sections of a first type conductor as first and second bit lines on first and second sides of the selector element stack, respectively; first and second diodes, the first diode in contact with the first bit line, the second diode in contact with the second bit line and a second type conductor disposed over the substrate and vertically traversing through a middle portion of the vertical structure as a word line. For each of the one or more selector element stacks: first and second memory elements, the first memory element disposed between the word line and the first diode, the second memory element disposed between the word line and the second diode; and first and second electrodes, the first electrode disposed between the first memory element and the first diode, the second electrode disposed between the second memory element and the second diode.

In another embodiment, a method of manufacturing a device is presented. A substrate is provided. An inter-layer dielectric (ILD) layer is formed over the substrate. A vertical structure having one or more memory cell stacks is formed on the ILD layer. Each of the one or more cell stacks is formed by forming first and second first type conductors on first and second sides of the cell stack, forming a first section of a memory layer adjacent the first first type conductor as a first memory element and a second section of the memory layer adjacent the second first type conductor as a second memory element, forming first and second electrodes with the first electrode adjacent the first memory element and the second electrode adjacent the second memory element, forming a conductor layer of a first polarity type between the first and second electrodes, and forming a dielectric layer over the first and second first type conductors, the first and second memory elements, the first and second electrodes, and the conductor layer of the first polarity type.

In yet another embodiment, a method of manufacturing a device is disclosed. A substrate is provided and an inter-layer dielectric (ILD) layer is formed over the substrate. A vertical structure having one or more memory cell stacks is formed on the ILD layer. Each of the one or more cell stacks is formed by forming a conductor layer of a first polarity type, forming a hard mask layer on the conductor layer of the first polarity type, forming trenches on first and second sides of the conductor layer of the first polarity type and hard mask layer, forming a first section of a memory layer adjacent the first side of the conductor layer of the first polarity type as a first memory element and a second section of the memory layer adjacent the second side of the conductor layer of the first polarity type as a second memory element, forming a first electrode between the first memory element and the conductor layer of the first polarity type and the hard mask layer, and forming a second electrode between the second memory element and the conductor layer of the first polarity type and the hard mask layer. First and second sections of a conductor layer of a first polarity type as first and second word lines are formed on first and second sides of the cell stack. A second dielectric layer is formed over the first and second word lines, the first and second memory elements, the first and second electrodes, and the hard mask layer. The method also includes etching an opening through a middle portion of the vertical structure and the ILD layer, and filling the opening with a conductor of a second polarity type.

In a further embodiment, a method of manufacturing a device is disclosed. A substrate is provided and an inter-layer dielectric (ILD) layer is formed over the substrate. A vertical structure having one or more selector element stacks is formed on the ILD layer. Each of the one or more selector element stacks is formed by forming first and second sections of first type conductor as first and second bit lines on first and second sides of the selector element stack, forming a conductor layer of a first polarity type between the first and second bit lines, and forming first and second sections of a conductor layer of a second polarity type, the first section of conductor layer of the second polarity type is disposed between the first bit line and the conductor layer of the first polarity type, the second section of conductor layer of the second polarity type is disposed between the second bit line and the conductor layer of the first polarity type. The method also includes etching an opening through a middle portion of the vertical structure. The opening is filled with a metal to form a word line. A first section of a memory layer on a first side of the word line as a first memory element and a second section of the memory layer on a second side of the word line as a second memory element are formed. The method also includes forming, for each of the one or more selector element stacks, first and second electrodes. The first electrode is between the first memory element and the conductor layer of the first polarity type of the respective selector element stack, and the second electrode is between the second memory element and the conductor layer of the first polarity type of the respective selector element stack.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the present disclosure. In the following description, various embodiments of the present disclosure are described with reference to the following drawings, in which:

FIGS. 5a-5m show cross-sectional views of an embodiment of a process for manufacturing a memory device;

DETAILED DESCRIPTION

Embodiments generally relate to semiconductor devices. More particularly, some embodiments relate to memory devices, such as NVM devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

Figure 1A:
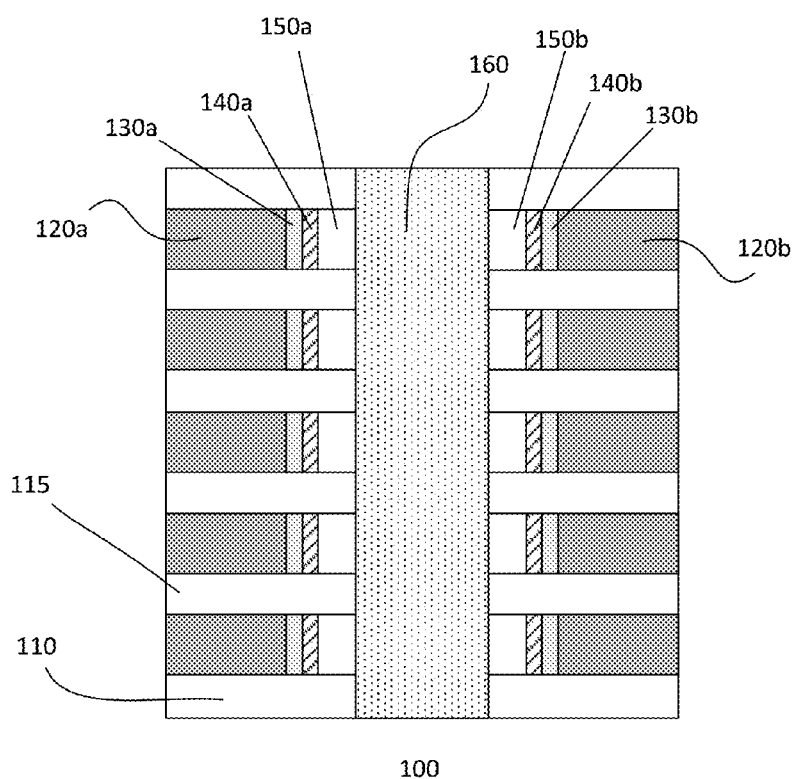
FIG. 1a shows a schematic diagram of an embodiment of a memory device.

FIG. 1a shows a schematic diagram of an embodiment of a memory device 100. In one embodiment, the memory device 100 includes a substrate (not shown), an ILD layer 110 disposed over the substrate, a vertical structure disposed over the substrate and on the ILD layer 110, and a selector element disposed over the substrate and vertically traversing through a middle portion of the vertical structure. The vertical structure includes one or more memory cell stacks with a dielectric layer 115 between every two adjacent cell stacks. As shown in FIG. 1a, each of the one or more cell stacks includes first and second first type conductors 120a and 120b and first and second memory elements on first and second sides of the cell stack, respectively. The first type conductor, for example, may be referred to as word line.

In one embodiment, each of the memory elements is a resistive memory element, forming a resistive RAM (RRAM cell). For example, the resistive element includes a programmable resistive element. The programmable resistive element can be in a first or second resistive state. In one embodiment, the first state is a high resistive state and the second state is a low resistive state. One of the resistive states represents a logic "0" while the other represents a logic "1". For example, the high resistive state may represent a logic 0 while the low resistive state may represent a logic 1. Having the high resistive state representing a logic 1 and the low resistive state representing a logic 0 may also be useful. Other configurations of data storage for the RRAM cell may also be useful.

In one embodiment, the programmable resistive element includes programmable resistive stack. The programmable resistive stack, for example, includes a programmable resistive layer and an electrode layer. As shown in FIG. 1a, each of the one or more cell stacks includes first and second programmable resistive layers 130a and 130b and first and second electrodes 140a and 140b. The resistive layer, for example, may be a transitional metal oxide, such as titanium oxide (TiO$_x$), nickel oxide (NiOx), aluminum oxide (AlOx), hafnium oxide (HfOx), tungsten oxide (WOx), tantalum oxide (TaOx), vanadium oxide (VOx), or copper oxide (CuOx). Other suitable types of programmable resistive layers may also be useful. A programmable resistive layer is subjected to a forming procedure which creates conduction paths or filaments after it is formed. The filaments can be reset or broken by subjecting the programmable resistive material to a reset procedure or condition; the filaments can be set or re-formed by subjecting the programmable resistive layer to a set procedure or condition. Once set or reset, the state of the resistor is stable until reset or set. A resistor with broken filaments is in a high resistive state while a reset resistor with re-formed filaments is in a low resistive state. The electrode layer, for example, may be a platinum electrode layer. Other suitable types of electrode layers may also be useful. In one embodiment, the electrode layer may be disposed adjacent the resistive layer. Other configurations of resistive stack may also be useful. The first resistive layer 130a is disposed in between the first word line 120a and the first electrode 140a. The second resistive layer 130b is disposed in between the second word line 120b and the second electrode 140b.

As for the selector element, it includes respective first and second selector diodes for the first and second memory elements of each of the one or more cell stacks. In one embodiment, as shown in FIG. 1a, the selector element includes first and second sections of a conductor layer of a first polarity type 150a and 150b adjacent the first and second electrodes 140a and 140b of each of the one or more cell stacks, respectively, and a via of a conductor of a second polarity type 160 vertically traversing through the middle portion of the vertical structure. The conductor layers of the first and second polarity types, for example, include polysilicon material. Other suitable types of materials may also be useful. Thus, for each cell stack, the first section of the conductor layer of the first polarity type 150a and the via of the conductor layer of the second polarity type 160 form a diode as a selector. Likewise, the second section of the conductor layer of the first polarity type 150b and the via of the conductor layer of the second polarity type 160 form another diode as another selector. The via of the conductor of the second polarity type 160 is coupled to a second type conductor (not shown). The second type conductor for example, may be referred to as bit line. The bit line, for example, may be disposed at the bottom or top of the vertical structure.

In one embodiment, the first polarity type is n-type while the second polarity type is p-type. Alternatively, the first polarity type is p-type while the second polarity type is n-type. In one embodiment, the first type conductor 120 is a word line while the second type conductor is a bit line. Alternatively, the first type conductor 120 is a bit line while the second type conductor is a word line.

As described, the first and second memory elements are RRAM. It is understood that other suitable types of memory elements may also be useful. For example, the memory element may be any type of memory element used in storing data, such as but are not limited to PCRAM, FeRAM and MRAM.

Figure 1B:
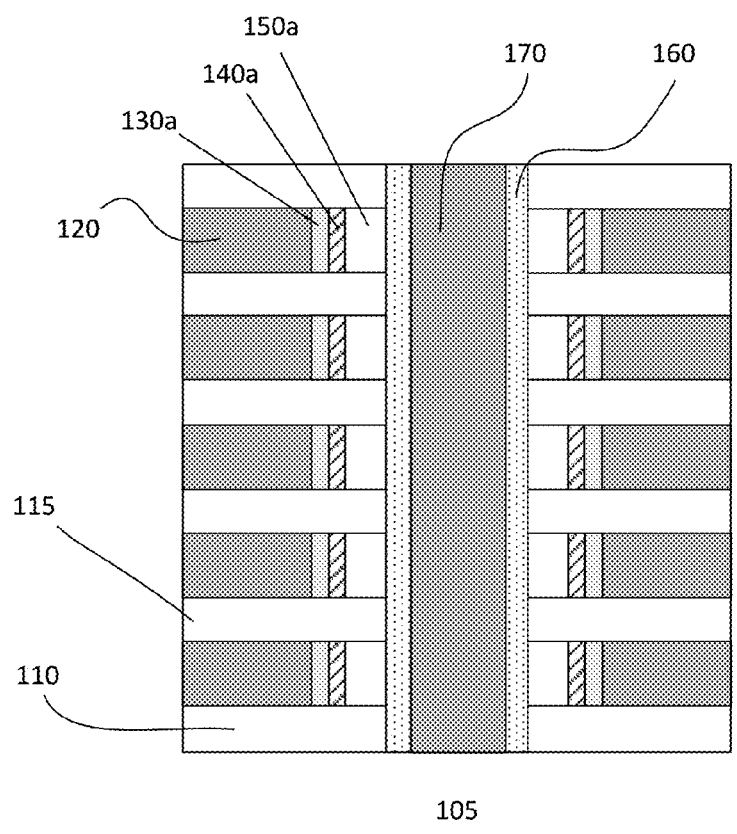
FIG. 1b shows a schematic diagram of another embodiment of a memory device.

FIG. 1b shows a schematic diagram of another embodiment of a memory device 105, which is a variation of memory device 100. As most components of the memory device 105 are identical or similar to corresponding components of the memory device 100, in the interest of brevity the description below focuses on those components of the memory device 105 that are different. Compared to the memory device 100, the memory device 105 further includes a second type conductor 170, such as a bit line, formed in and vertically traversing through a middle portion of the selector element. The second type conductor 170, for example, includes Cu, Al, Ti, TaN or TiN/Cu. Other suitable types of conductive materials may also be useful.

A bit access may include different types of memory operations. For example, a bit access may include forming, set (write), reset (erase) and read operations. Table 1 shows the various signals applied to the terminals of the memory device 100 or 105, depending on the desired operation and bits to access.

TABLE 1

| | BL | | WL | |
|---|---|---|---|---|
| Operation | Sel. | Un-sel. | Sel | Un-sel. |
| Forming | $V_{form, BL}$ | Float | $V_{form, WL}$ | Float |
| Set | $V_{set, BL}$ | Float | $V_{sel, WL}$ | Float |
| Reset | $V_{reset, BL}$ | Float | $V_{reset, WL}$ | Float |
| Read | $V_{read, BL}$ | Float | $V_{read, WL}$ | Float |

The embodiments as described with respect to FIGS. 1a-1b above result in advantages. For example, the memory device 100 is a three-dimensional vertical RAM that has a small cell size, or foot print with multiple bits per $F^2$. The memory device, as described, is provided with side selectors. For example, the memory elements are coupled to the pn diode side selectors which help eliminate sneak path while increasing memory density and achieves multiple bits per cell area ($F^2$). Materials used for the selector element are also fab-friendly.

Figure 2:
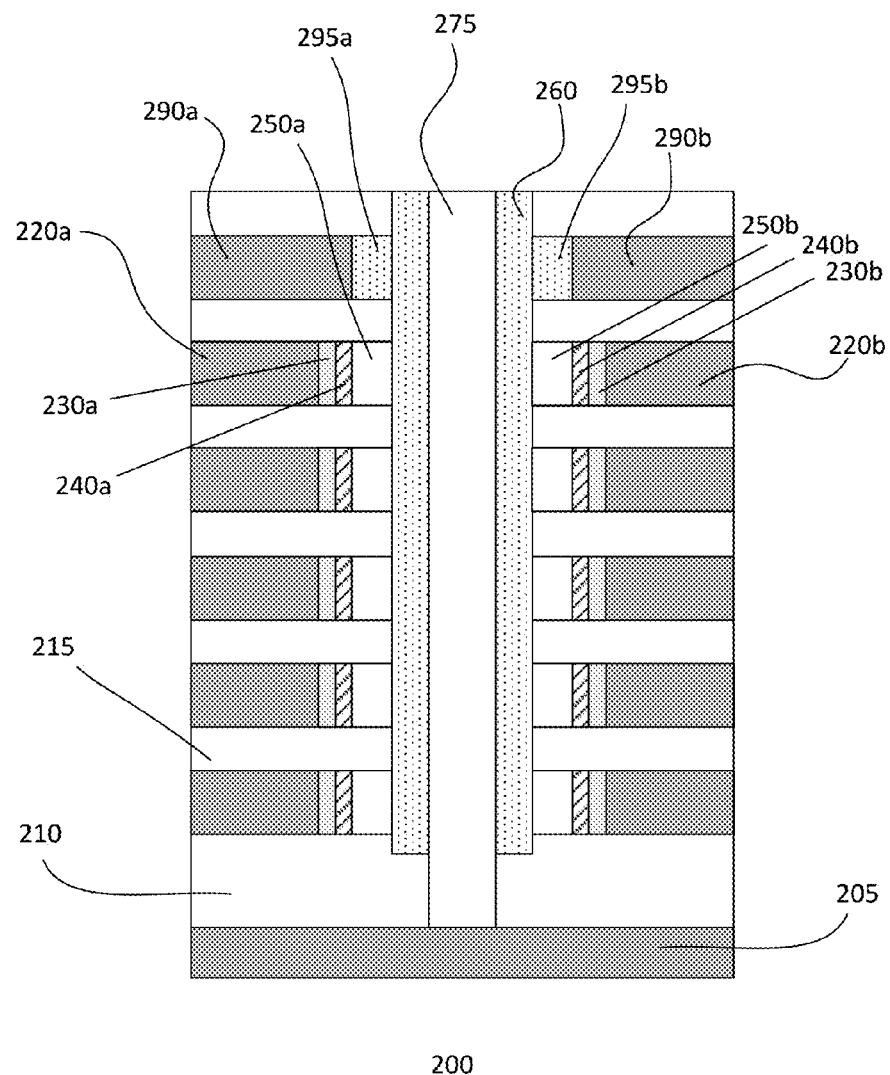
FIG. 2 shows a schematic diagram of another embodiment of a memory device.

FIG. 2 shows a schematic diagram of another embodiment of a memory device 200. In one embodiment, the memory device 200 includes a substrate (not shown), an ILD layer 210 disposed over the substrate, a vertical structure disposed over the substrate, and a selector element disposed over the substrate and vertically traversing through a middle portion of the vertical structure. The vertical structure includes one or more memory cell stacks with a dielectric layer 215 between every two adjacent cell stacks. As shown in FIG. 2, each of the one or more cell stacks includes first and second first type conductors 220a and 220b on first and second sides of the cell stack, respectively, and first and second memory elements. The first type conductor, for example, may be referred to as a word line. The first and second memory elements include materials similar to that described in FIG. 1a. For example, each of the one or more cell stacks includes first and second programmable resistive layers 230a and 230b and first and second electrodes 240a and 240b. The first resistive layer 230a is disposed between the first word line 220a and the first electrode 240a. The second resistive layer 230b is disposed between the second word line 220b and the second electrode 240b. The selector element includes respective first and second selector diodes for the first and second memory elements of each of the one or more cell stacks.

In one embodiment, the selector element of the memory device 200 includes a bipolar junction transistor (BJT). As shown in FIG. 2, the selector element includes a BJT and first and second sections of a conductor layer of a first polarity type 250a and 250b adjacent the first and second electrodes 240a and 240b of each of the one or more cell stacks, respectively. The BJT includes a first via 260 of a conductor layer of a second polarity type vertically traversing through the middle portion of the vertical structure, and a second via 275 of a conductor layer of the first polarity type formed in and vertically traversing through a middle portion of the first via 260. The conductor layers of the first and second polarity types, for example, include polysilicon. Other suitable types of material may also be useful.

In one embodiment, the memory device 200 includes a second type conductor 205 disposed on the substrate and serves as, for example a bit line, and an ILD layer 210 disposed on the second type conductor layer 205 which is the bit line.

In one embodiment, the memory device 200 further includes a select line stack disposed on the vertical structure. Alternatively, the select line stack may be disposed between the ILD layer 210 and the vertical structure. In one embodiment, the select line stack includes first and second select lines 290a and 290b on first and second sides of the vertical structure, respectively, and first and second sections of a conductor layer of the second polarity type 295a and 295b between the first select line 290a and the BJT and between the second select line 290b and the BJT, respectively.

In one embodiment, the first polarity type is n-type while the second polarity type is p-type. Alternatively, the first polarity type is p-type while the second polarity type is n-type. In one embodiment, the first type conductor 220 is a word line while the second type conductor 205 is a bit line. Alternatively, the first type conductor 220 is a bit line while the second type conductor 205 is a word line.

In one embodiment, the first and second memory elements are RRAM. For example, each of the first and second memory elements includes resistive layers made of inorganic or organic material showing thermal or ionic resistive switching effects. It is understood that other suitable types of memory elements may also be useful. For example, the memory element may be any type of memory element used in storing data, such as but are not limited to PCRAM, FeRAM and MRAM.

A bit access may include different types of memory operations. For example, a bit access may include forming, set (write), reset (erase) and read operations. Table 2 shows the various signals applied to the terminals of the memory device 200, depending on the desired operation and bits to access.

TABLE 2

| | BL | | WL | | SL | |
|---|---|---|---|---|---|---|
| Operation | Sel. | Un-sel. | Sel | Un-sel. | Sel | Un-sel. |
| Forming | $V_{form,BL}$ | Float or GND | $V_{form,WL}$ | Float or GND | $V_{form,SL}$ | Float or GND |
| Set | $V_{set,BL}$ | Float or GND | $V_{sel,WL}$ | Float or GND | $V_{sel,SL}$ | Float or GND |
| Reset | $V_{reset,BL}$ | Float or GND | $V_{reset,WL}$ | Float or GND | $V_{reset,SL}$ | Float or GND |
| Read | $V_{read,BL}$ | Float or GND | $V_{read,WL}$ | Float or GND | $V_{read,SL}$ | Float or GND |

Accordingly, the memory device 200 is a three-dimensional vertical RAM that has a small cell size, or foot print, with multiple bits per $F^2$. The BJT side selectors of this design helps eliminate sneak path while increasing memory density. Moreover, the BJT side selectors allow bipolar operation. Bipolar RRAM could be employed. Materials used for the selector element are fab-friendly.

Figure 3:
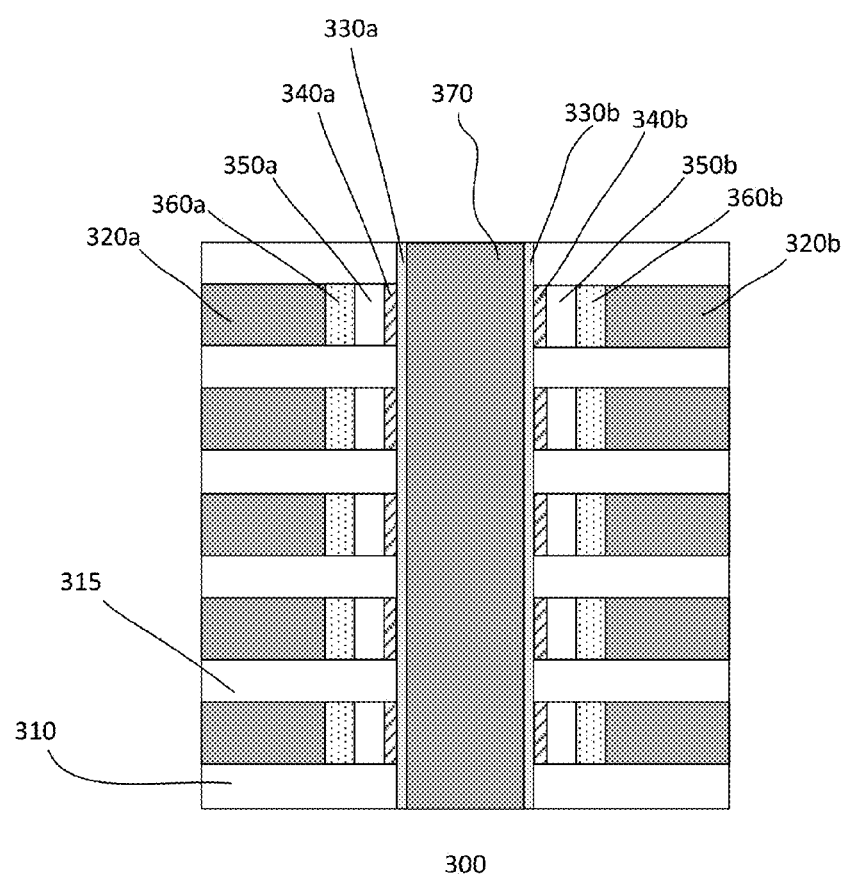
FIG. 3 shows a schematic diagram of yet another embodiment of a memory device.

FIG. 3 shows a schematic diagram of yet another embodiment of a memory device 300. In one embodiment, the memory device 300 includes a substrate (not shown), an ILD layer 310, and a vertical structure disposed over the substrate and on the ILD layer 310. The vertical structure includes one or more selector element stacks with a dielectric layer 315 between every two adjacent selector element stacks. Each of the one or more selector element stacks includes first and second sections of first type conductors 320a and 320b on first and second sides of the selector element stack, respectively, and first and second diodes, and a second type conductor 370 disposed over the substrate and vertically traversing through a middle portion of the vertical structure. The first type conductor, for example, may be referred to as a bit line while the second type conductor, for example, may be referred to as a word line. The first diode includes a first section of a conductor layer of a first polarity type 350a and a first section of a conductor layer of a second polarity type 360a. The second diode includes a second section of a conductor layer of a first polarity type 350b and a second section of a conductor layer of a second polarity type 360b. The first diode is in contact with the first bit line 320a. The second diode is in contact with the second bit line 320b.

For each of the one or more selector element stacks, the memory device 300 further includes first and second memory elements having first and second resistive layers. The first resistive layer 330a is disposed between the word line 370 and the first diode. The second resistive layer 330b is disposed between the word line 370 and the second diode. The first electrode 340a is disposed between the first resistive layer 330a and the first diode. The second electrode 340b is disposed between the second resistive layer 330b and the second diode.

In one embodiment, the first polarity type is n-type while the second polarity type is p-type. Alternatively, the first polarity type is p-type while the second polarity type is n-type. In one embodiment, the first type conductor 320 is a bit line while the second type conductor 370 is a word line.

Alternatively, the first type conductor 320 is a word line while the second type conductor is a bit line.

In one embodiment, the first and second memory elements are RRAM. It is understood that other suitable types of memory elements may also be useful. For example, the memory element may be any type of memory element used in storing data, such as but are not limited to PCRAM, FeRAM and MRAM.

In one embodiment, the connection to the second type conductor 370 may be either at the bottom or on top of the vertical structure. For example, the connection for the word line may be either at the bottom or on top of the vertical structure. Other suitable configurations may also be used.

Various signals similar to the ones presented in Table 1 may be applied to the terminals of the memory device 300, depending on the desired operation and bits to access. The embodiment as described with respect to FIG. 3 includes similar or all advantages such as those described in FIGS. 1a-1b and FIG. 2. As such, common advantages will not be described or described in detail.

Figure 4A:
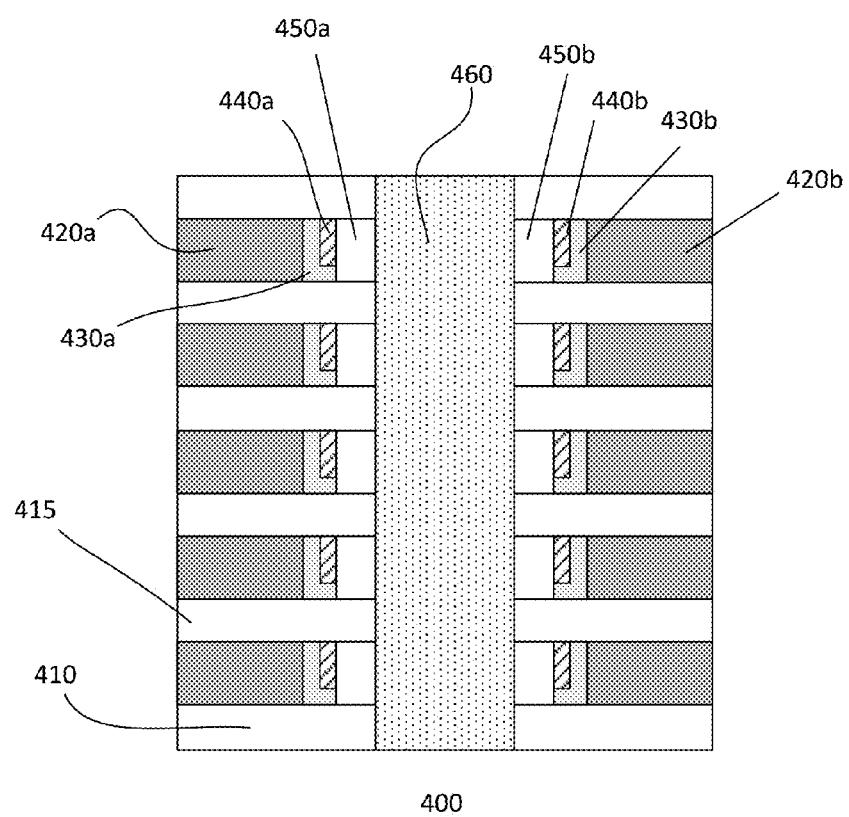
FIG. 4a shows a schematic diagram of yet another embodiment of a memory device.

FIG. 4a shows a schematic diagram of yet another embodiment of a memory device 400. In one embodiment, the memory device 400 includes a substrate (not shown), an ILD layer 410 disposed over the substrate, a vertical structure disposed over the substrate and on the ILD layer 410, and a selector element disposed over the substrate and vertically traversing through a middle portion of the vertical structure. The vertical structure includes one or more memory cell stacks with a dielectric layer 415 between every two adjacent cell stacks. As shown in FIG. 4a, each of the one or more cell stacks includes first and second first type conductors 420a and 420b on first and second sides of the cell stack, respectively, and first and second memory elements.

The first and second memory elements include first and second resistive layers 430a and 430b. The first resistive layer 430a is disposed between the first word line 420a and the first electrode 440a. The second resistive layer 430b is disposed between the second word line 420b and the second electrode 440b. In one embodiment, a portion of the first resistive layer 430a contacts the first electrode 440a and another portion of the first resistive layer 430a contacts the first diode. Similarly, a portion of the second resistive layer 430b contacts the second electrode 440b and another portion of the second resistive layer 430b contacts the second diode.

The selector element includes respective first and second selector diodes for the first and second memory elements of each of the one or more cell stacks. As shown in FIG. 4a, the first and second resistive layers 430a and 430b are liners for the first and second electrodes 440a and 440b.

In one embodiment, as shown in FIG. 4a, the selector element includes first and second sections of a conductor layer of a first polarity type 450a and 450b adjacent the first and second electrodes 440a and 440b of each of the one or more cell stacks, respectively, and a via of a conductor layer of a second polarity type 460 vertically traversing through the middle portion of the vertical structure. The conductor layers of the first and second polarity types, for example, include polysilicon. The conductor layers may also include other suitable types of materials. Thus, for each cell stack, the first section of the conductor layer of the first polarity type 450a and the via of the conductor layer of the second polarity type 460 form a diode as a selector. Likewise, the second section of the conductor layer of the first polarity type 450b and the via of the conductor layer of the second polarity type 460 form another diode as another selector.

In one embodiment, the first polarity type is n-type while the second polarity type is p-type. Alternatively, the first polarity type is p-type while the second polarity type is n-type. In one embodiment, the first type conductor 420 is a word line while the second type conductor is a bit line. Alternatively, the first type conductor 420 is a bit line while the second type conductor is a word line.

In one embodiment, the first and second memory elements are RRAM. It is understood that other suitable types of memory elements may also be useful. For example, the memory element may be any type of memory element used in storing data, such as but are not limited to PCRAM, FeRAM and MRAM.

Various signals similar to the ones presented in Table 1 may be applied to the terminals of the memory device 400, depending on the desired operation and bits to access. Accordingly, the memory device 400 is a three-dimensional vertical RAM that has a small cell size, or foot print, with multiple bits per $F^2$. The pn diode side selectors of this design helps eliminate sneak path while increasing memory density. Materials used for the selector element are fab-friendly.

Figure 4B:
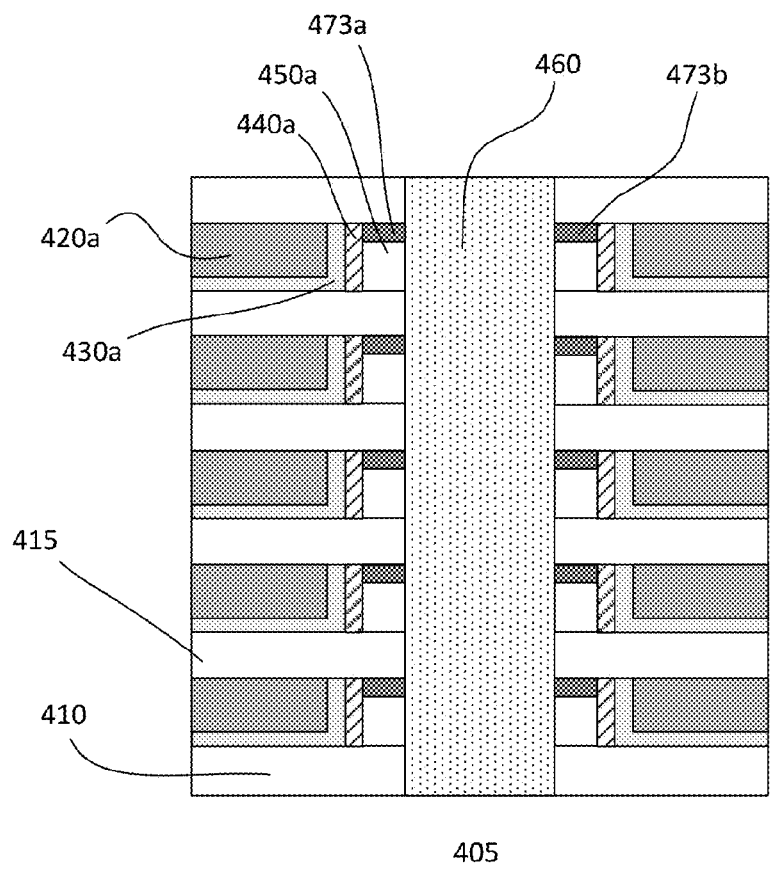
FIG. 4b shows a schematic diagram of still another embodiment of a memory device.

FIG. 4b shows a schematic diagram of still another embodiment of a memory device 405. As most components of the memory device 405 are identical or similar to corresponding components of the memory device 400, in the interest of brevity, the description below focuses on those components of the memory device 405 that are different. Compared to the memory device 400, the memory device 405 further includes first and second sections of a hard mask layer 473a and 473b. The hard mask layer, for example, includes a nitride layer. Other suitable types of materials may also be used as the hard mask layer. The first section of the hard mask layer 473a is disposed on the first section of the conductor layer of the first polarity type 450a. The second section of the hard mask layer 473b is disposed on the second section of the conductor layer of the first polarity type 450b. As shown in FIG. 4b, the first and second resistive layers 430a and 430b are liners for the first and second first type conductors 420a and 420b.

Various signals similar to the ones presented in Table 1 may be applied to the terminals of the memory device 405, depending on the desired operation and bits to access. The memory device 405 includes the same or similar advantages as described with respect to FIGS. 1a-1b, FIG. 2, FIG. 3 and FIG. 4a. The hard mask layer as included in the memory device 405 not only serves as a protection layer during processing, it could also be used to tune or adjust the height of the diode selector. For example, by reducing the area, the conducting filaments to the resistive layer of the RRAM would be restricted, thereby allowing for more precise control of filament formation and better uniformity.

Figure 5A:
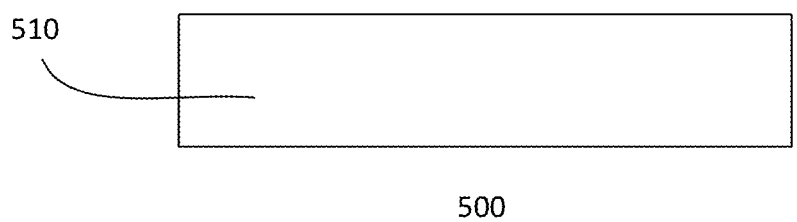
Figure 5B:
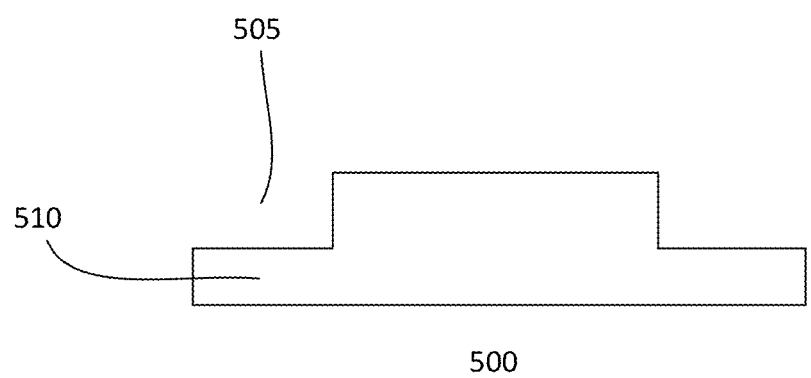
Figure 5C:
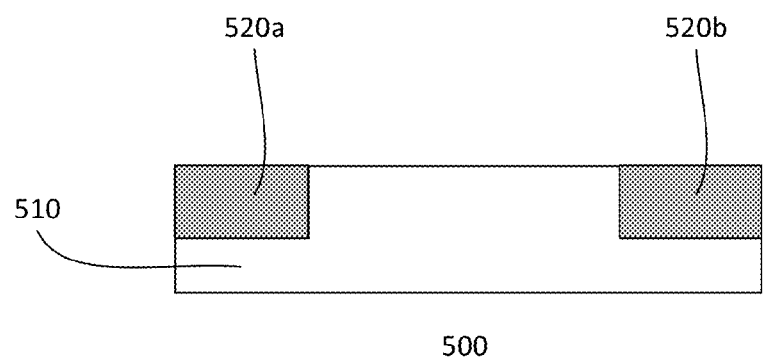
Figure 5D:
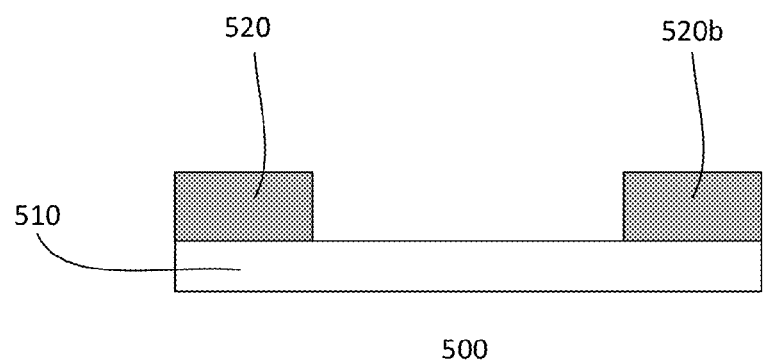

FIGS. 5a-5m show cross-sectional views of an embodiment of a process for manufacturing a memory device 500. The following description refers to FIGS. 5a-5m. In one embodiment, the process includes: providing a substrate (not shown); forming an ILD layer 510 over the substrate (not shown) as shown in FIG. 5a; and forming, on the ILD layer 510, a vertical structure having one or more memory cell stacks. In forming each of the one or more cell stacks, the process forms trenches 505 on first and second sides of the ILD layer 510 as shown in FIG. 5b, forms first and second sections of a conductor layer as first and second first type conductors 520a and 520b in the trenches as shown in FIG. 5c, and etches away a central portion of the ILD layer 510 as shown in FIG. 5d by any suitable mask and etch techniques. The first type conductor, for example, may be referred to as word line. The conductor layer which forms the first type conductors 520a and 520b, for example, includes Cu (or TiN+Cu or Al) and may be formed over the ILD layer by chemical vapor deposition (CVD). Depending on the material used, a planarization process, such as chemical mechanical polishing (CMP), may be performed after forming the conductor layer to provide a planar or substantially planar top surface. Other suitable types of material and techniques may also be used.

Figure 5E:
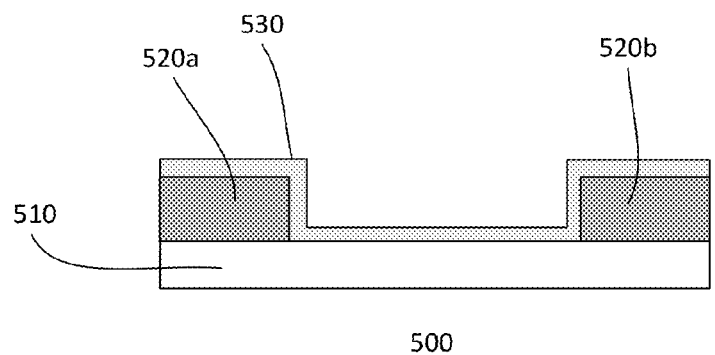
Figure 5F:
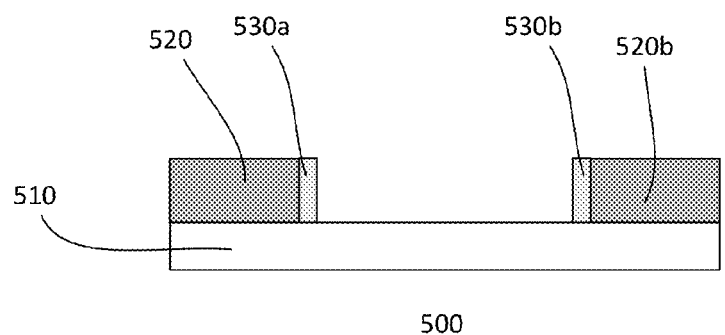

The process continues to form a resistive layer 530 over the substrate. The resistive layer, for example, may be a transitional metal oxide, such as titanium oxide ($TiO_x$), nickel oxide (NiOx), aluminum oxide (AlOx), hafnium oxide (HfOx), tungsten oxide (WOx), tantalum oxide (TaOx), vanadium oxide (VOx), or copper oxide (CuOx). Other suitable types of programmable resistive layers may also be useful. The resistive layer, for example, may be formed over the first and second first type conductors 520a and 520b and lines the opening in between the first type conductors by CVD process as shown in FIG. 5e. An anisotropic etch, such as RIE, may be performed to remove horizontal portions of the resistive layer from the top of the first type conductors and bottom of the opening, leaving the resistive layer lining sides of the first type conductors to form first and second resistive layers 530a and 530b of the first and second memory elements as shown in FIG. 5f. Other suitable techniques may also be employed to form the first and second resistive layers 530a and 530b.

Figure 5G:
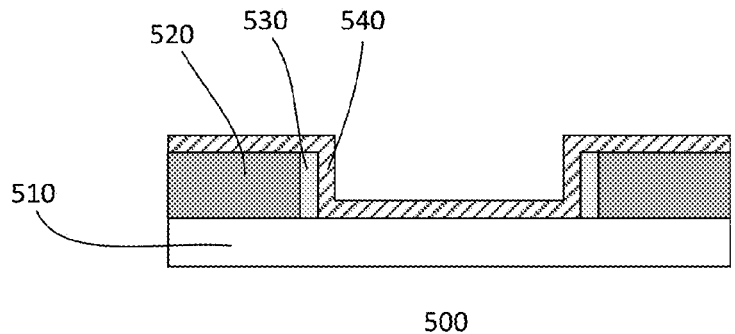
Figure 5H:
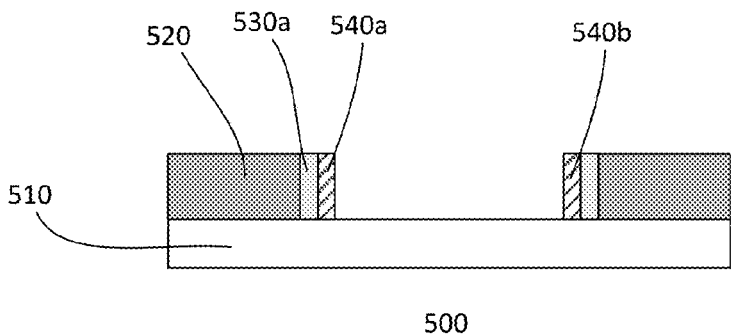

The process also forms first and second electrodes 540a and 540b with the first electrode 540a adjacent the first resistive layer 530a and the second electrode 540b adjacent the second resistive layer 530b. An electrode layer 540, such as but not limited to a platinum electrode layer, is formed over the first and second first type conductors 520a and 520b and the first and second resistive layers 530a and 530b and lines the remaining opening in between the first and second resistive layers as shown in FIG. 5g. An anisotropic etch, such as RIE, may be performed to remove horizontal portions of the electrode layer from the top of the first type conductors and first and second resistive layers as well as bottom of the remaining opening, leaving the electrode layer lining sides of the first and second resistive layers 530a and 530b to form first and second electrodes 540a and 540b of the first and second memory elements as shown in FIG. 5h. Other suitable techniques may also be employed to form the first and second electrodes 540a and 540b.

Figure 5I:
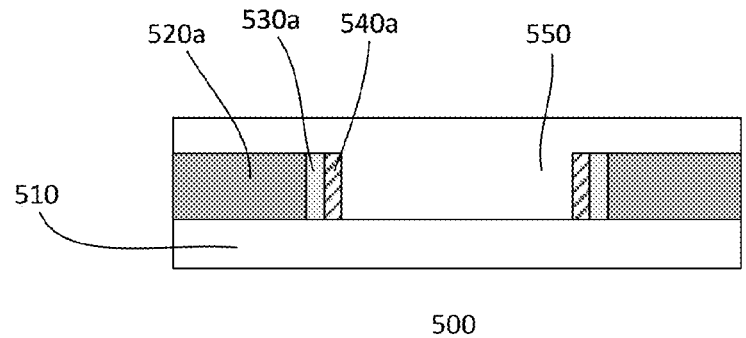
Figure 5J:
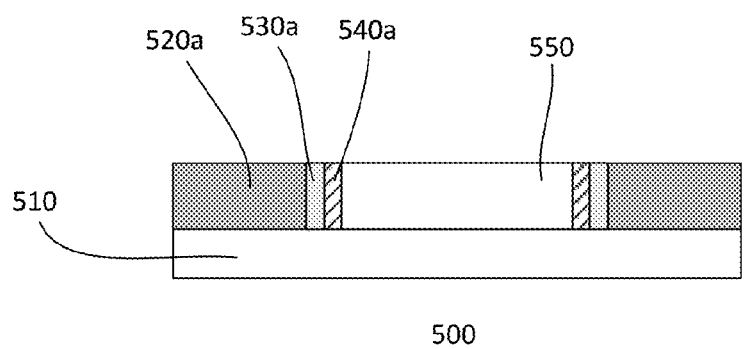

Referring to FIGS. 5i and 5j, the process continues to form a conductor layer of a first polarity type 550 between the first and second electrodes 540a and 540b. In one embodiment, a polysilicon layer is formed over the substrate and fills the remaining opening. The polysilicon layer may be formed over the substrate by CVD process. Other suitable types of material and techniques may also be employed. A planarization process may be performed to remove excess polysilicon material over the substrate such that a substantially planar surface is formed between the first type conductors, the first and second memory elements and the polysilicon layer. The planarization process may be performed by a CMP process. First polarity type dopants may be introduced during deposition (in-situ dope) of the polysilicon layer to form the conductor layer of the first polarity type 550. The concentration of the first polarity type dopants, for example, may be about $10^{20}$ cm$^{-3}$, forming a heavily doped conductor layer. Other suitable techniques and dopant concentrations for the first polarity type dopants may also be useful.

Figure 5K:
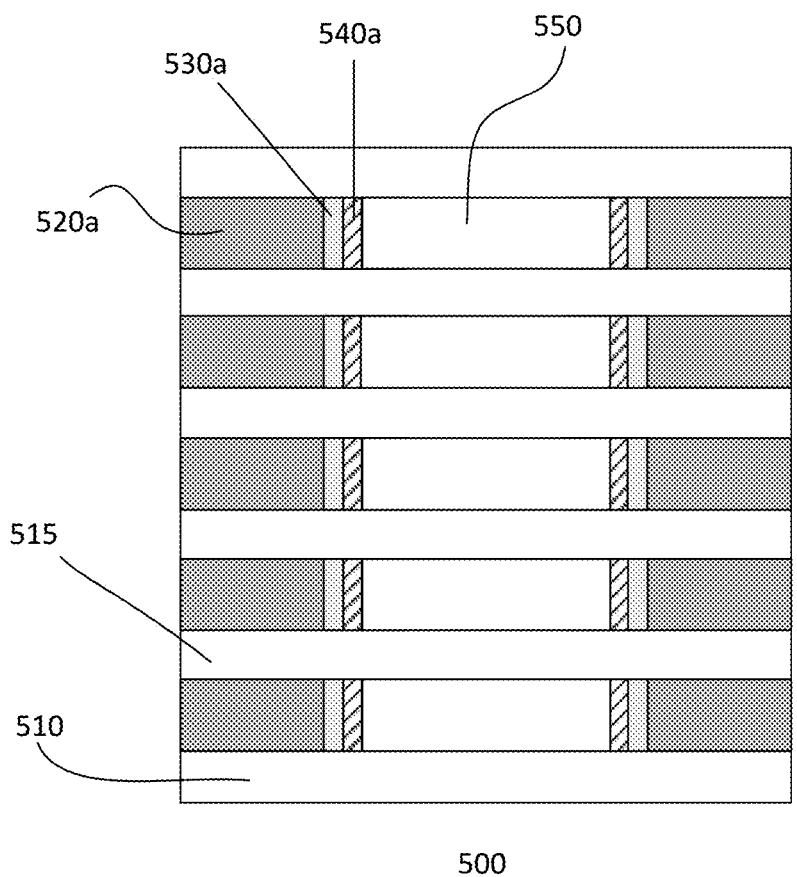
Figure 5I:
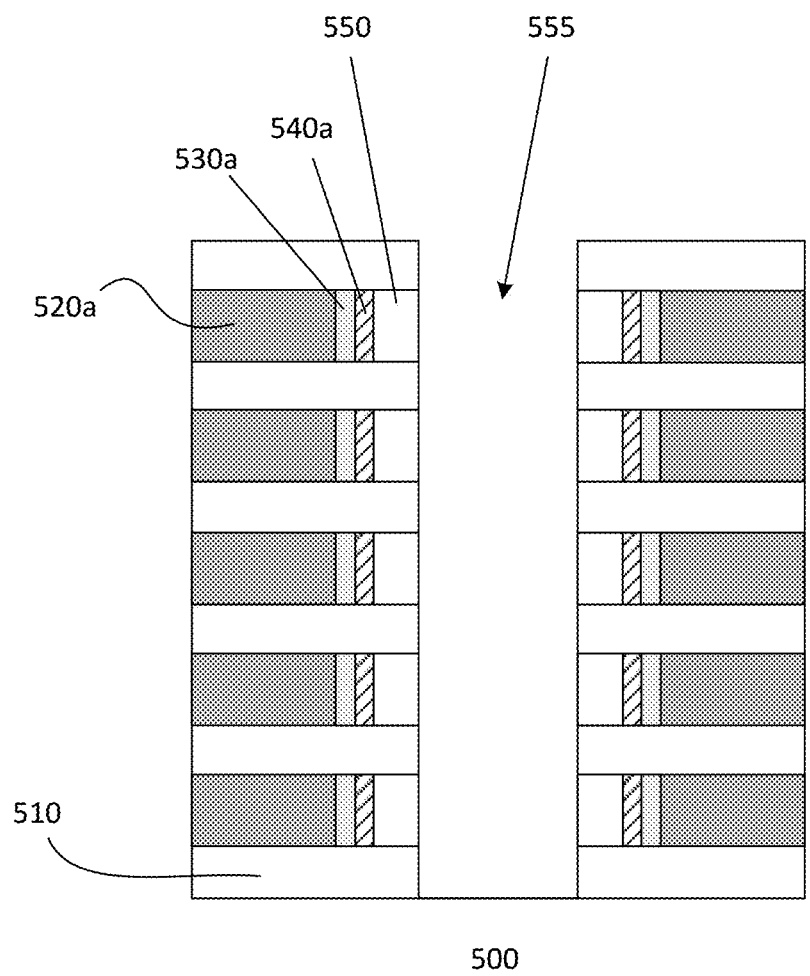

The process further forms a dielectric layer 515 over the first and second first type conductors 520a and 520b, the first and second memory elements 530 and 540, and the conductor layer of the first polarity type 550. The process steps as described in FIGS. 5a to 5j may be repeated until the desired numbers of cell stacks which form a vertical structure such as that shown in FIG. 5k is formed. The process continues to form an opening 555 through a middle portion of the vertical structure and the ILD layer 510 as shown in FIG. 5*l*. The opening 555 is formed by suitable mask and etch techniques.

Figure 5M:
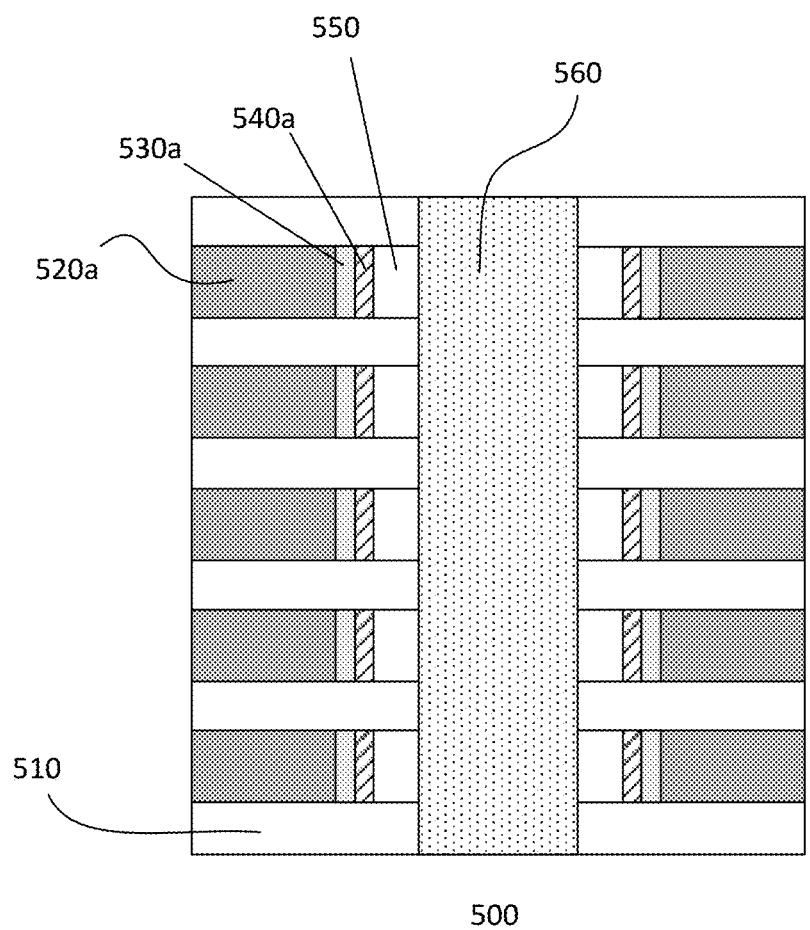

Referring to FIG. 5*m*, the process continues to fill the opening 555 with a conductor layer of a second polarity type 560. In one embodiment, the conductor layer of the second polarity type 560 which includes a polysilicon layer is formed over the substrate and fills the opening 555. The polysilicon layer may be formed over the substrate by CVD process. Other suitable types of material and techniques may also be employed. A planarization process may be performed to remove excess polysilicon material over the substrate such that a substantially planar surface is formed between the dielectric layer 515 of the top most cell stack and the polysilicon layer. The planarization process may be performed by a CMP process. Second polarity type dopants may be introduced during deposition (in-situ dope) of the polysilicon layer to form the conductor layer of the second polarity type 560. The concentration of the second polarity type dopants, for example, may be about $10^{20}$ $cm^{-3}$, forming a heavily doped conductor layer. Other suitable techniques and dopant concentrations for the second polarity type dopants may also be useful. The conductor of the second polarity type 560 is coupled to a second type conductor (not shown). The second type conductor (not shown) for example, may be referred to as bit line. The bit line, for example, may be disposed at the bottom or top of the vertical structure. The process as described in FIGS. 5*a*-5*m* forms a device similar to that shown in FIG. 1*a*.

In one embodiment, the first polarity type is n-type while the second polarity type is p-type. Alternatively, the first polarity type is p-type while the second polarity type is n-type. In one embodiment, the first type conductor 520 is a word line while the second type conductor is a bit line. Alternatively, the first type conductor 520 is a bit line while the second type conductor is a word line.

As described, the first and second memory elements are RRAM. It is understood that other suitable types of memory elements may also be useful. For example, the memory element may be any type of memory element used in storing data, such as but are not limited to PCRAM, FeRAM and MRAM.

The process may continue to complete the memory device. For example, BEOL process including interconnect metal levels may be provided to form interconnections to the terminals of the memory cells and other circuit components, as desired. Other processes may also be included to complete the memory device, for example, final passivation, dicing and packaging.

In another embodiment, instead of completely filling the opening with a conductive layer of a second polarity type 560 immediately after forming the opening 555 through a middle portion of the vertical structure and the ILD layer, the process continues to deposit the conductive layer of the second polarity type 560 as a liner layer, lining top surface of the top most ILD layer 515 and sidewalls of the opening 555. An anisotropic etch, such as RIE, may be performed to remove horizontal portions of the conductive layer of the second polarity type from the top surface of the top most ILD layer and bottom of the opening, leaving the liner layer of the second polarity type lining sides of the opening; and forming a second type conductor 170, such as a bit line, by filling the remaining opening with a conductor layer, such as metal. The metal material, for example, includes Cu. TiN+Cu or Al. A planarization process, such as CMP, may be performed to remove excess second type conductor layer over the top surface of the top most ILD layer such that a substantially planar surface is formed. The resultant structure as formed, for example, is similar to the device 105 shown in FIG. 1*b*.

The memory device 500 may be similar or identical to the memory device 100. Thus, advantages provided by the memory device 100 are also applicable to the memory device 500.

FIGS. 6*a*-6*i* show cross-sectional views of an embodiment of a process for manufacturing a memory device 600. The following description refers to FIGS. 6*a*-6*i*. The embodiment as described with respect to FIGS. 6*a*-6*i* below may include common features, materials and techniques described in FIGS. 5*a*-5*m*. These common features, materials and techniques will not be descried or described in detail.

Figure 6A:
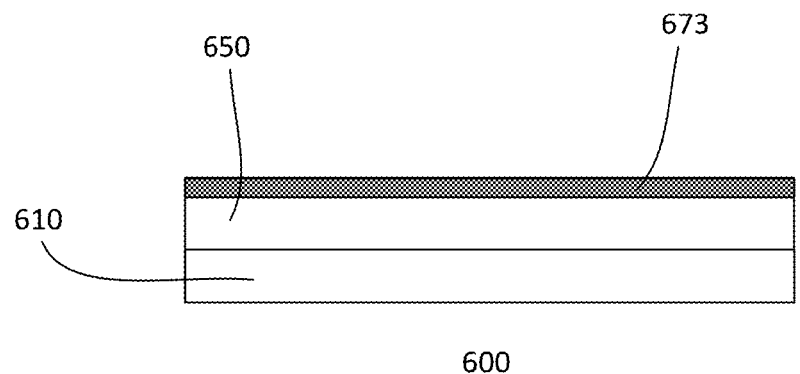
FIGS. 6a-6i show cross-sectional views of another embodiment of a process for manufacturing a memory device.
Figure 6B:
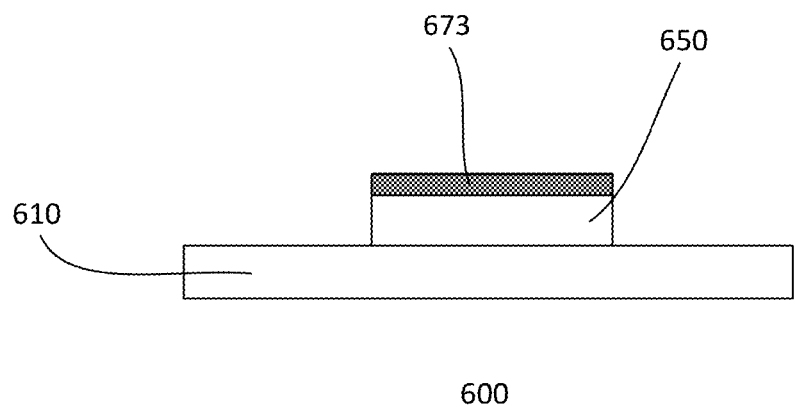

In one embodiment, the process 600 includes: providing a substrate (not shown); forming an ILD layer 610 over the substrate (not shown); and forming, on the ILD layer 610, a vertical structure having one or more memory cell stacks. In forming each of the one or more cell stacks, the process includes: forming a conductor layer of a first polarity type 650; forming a hard mask layer 673 on the conductor layer of the first polarity type 650 as shown in FIG. 6*a*; forming trenches on first and second sides of the conductor layer of the first polarity type 650 and the hard mask layer 673 as shown in FIG. 6*b*. The conductor layer, for example, includes a polysilicon layer and the hard mask, for example, includes a nitride layer. Other suitable materials may also be useful.

Figure 6C:
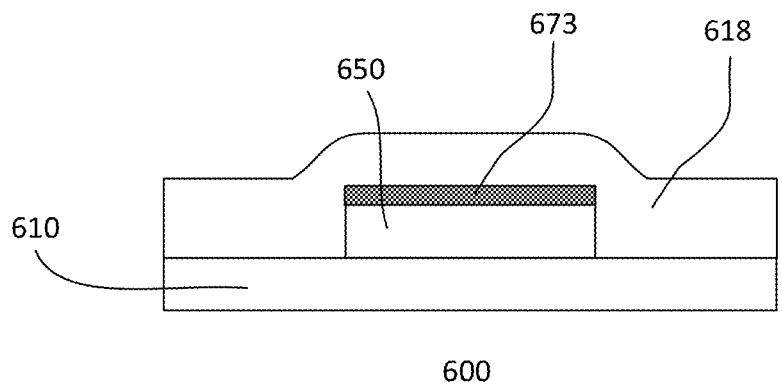
Figure 6D:
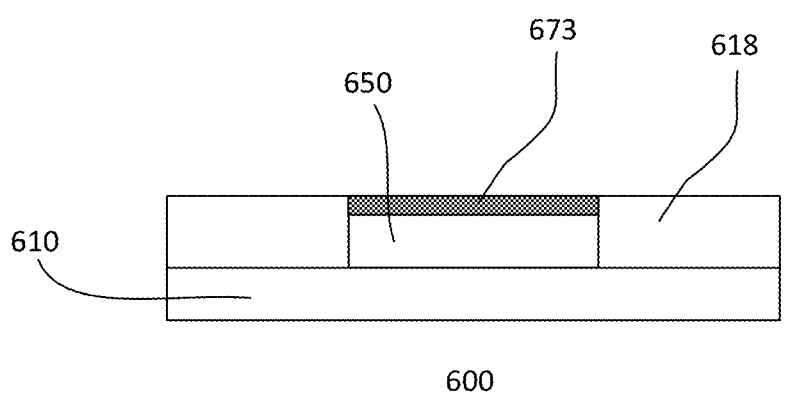

Referring to FIG. 6*c*, the process continues to form a dielectric layer 618 over substrate covering the patterned conductor layer of the first polarity 650 and hard mask 673. A planarization process is performed to remove excess dielectric material such that top surface of the dielectric layer 618 is substantially coplanar with the top surface of the hard mask 673 as shown in FIG. 6*d*. The planarization process, for example, includes a CMP process. Other suitable types of planarization process may also be employed.

Figure 6E:
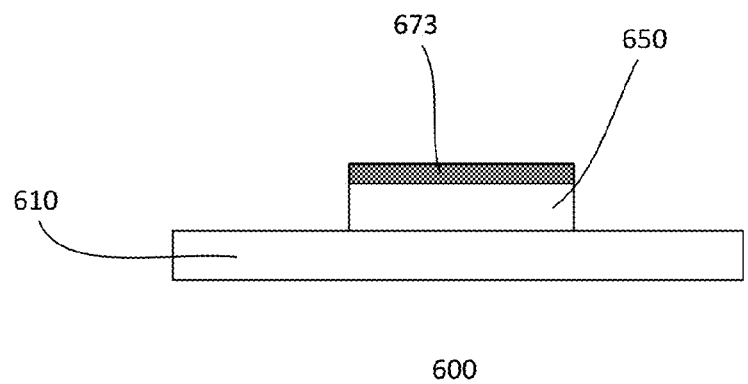

The process continues to form trenches on first and second sides of the conductor layer of the first polarity type 650 as shown in FIG. 6*e* by any suitable mask and etch techniques. For example, portions of the dielectric layer 618 adjacent to the first and second sides of the conductor of the first polarity type are removed to form the trenches.

Figure 6F:
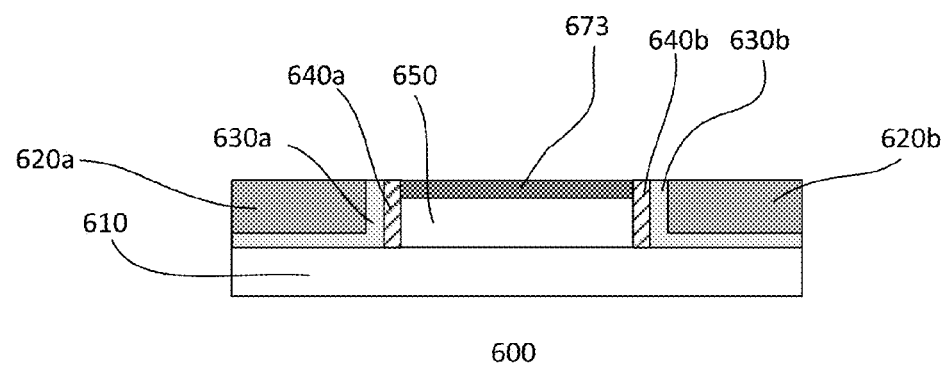

Referring to FIG. 6*f*, the process forms an electrode layer lining the ILD 610 as well as covering the patterned conductor layer of first polarity 650 and hard mask 673. An anisotropic etch, such as RIE, may be performed to remove horizontal portions of the electrode layer from the top of the hard mask 673 and ILD layer 610, leaving the electrode layer lining sides of the conductor layer of first polarity type 650 and sides of the hard mask 673 to form first and second electrodes 640*a* and 640*b* of the first and second memory elements as shown in FIG. 6*f*. Other suitable techniques may also be employed to form the first and second electrodes 640*a* and 640*b*.

The process continues to form a resistive layer over the substrate. The resistive layer, for example, may be formed over the ILD 610, the top surfaces of the first and second electrodes 640*a* and 640*b* and the top surface of the hard mask 673 by a CVD process. An anisotropic etch, such as RIE, may be performed to remove horizontal portions of the resistive layer from the top of the hard mask 673 and the top surfaces of the first and second electrodes 640*a* and 640*b*, leaving the resistive layer lining top surface of the ILD layer 610 and sides of the first and second electrodes 640*a* and 640*b* to form first and second resistive layers 630*a* and 630*b* of the first and second memory elements as shown in FIG. 6*f*. Other suitable techniques may also be employed to form the first and second resistive layers 630*a* and 630*b*. The process further forms first and second sections of a conductor layer as first and second first type conductors 620a and 620b in the trenches. The first type conductor, for example, may be referred to as word line. The conductor layer which forms the first type conductors 620a and 620b, for example, includes Cu and may be formed over the ILD layer by CVD. A planarization process is performed to remove excess conductor material such that top surfaces of the first and second first type conductors 620a and 620b are substantially coplanar with top surfaces of the hard mask 673, first and second resistive layer 630a and 630b and first and second electrodes 640a and 640b as shown in FIG. 6f. Other suitable types of material and techniques may also be used.

Figure 6G:
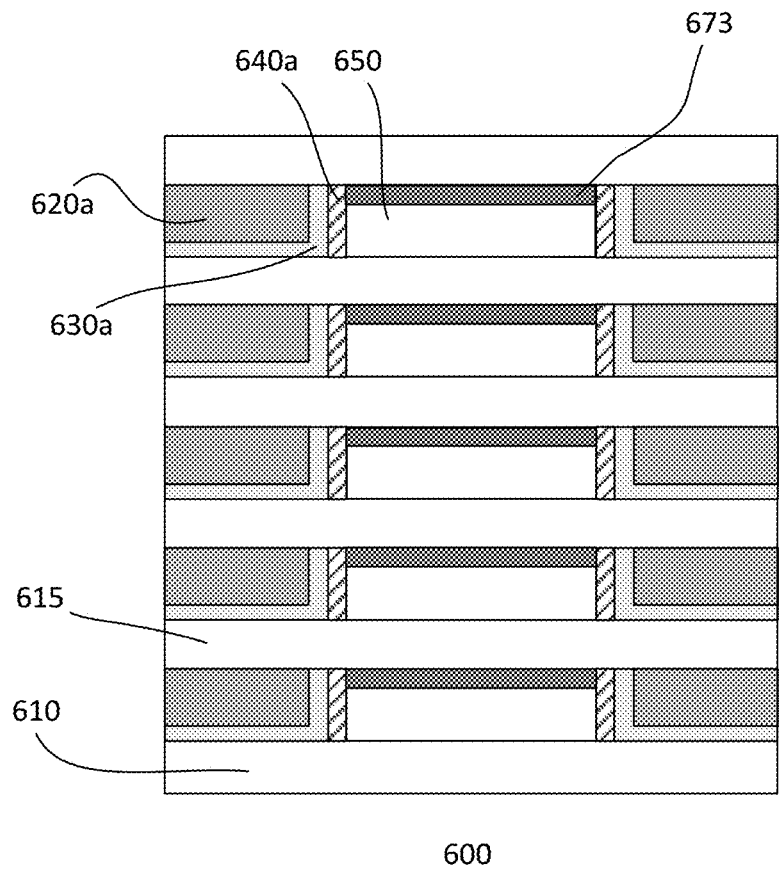
Figure 6H:
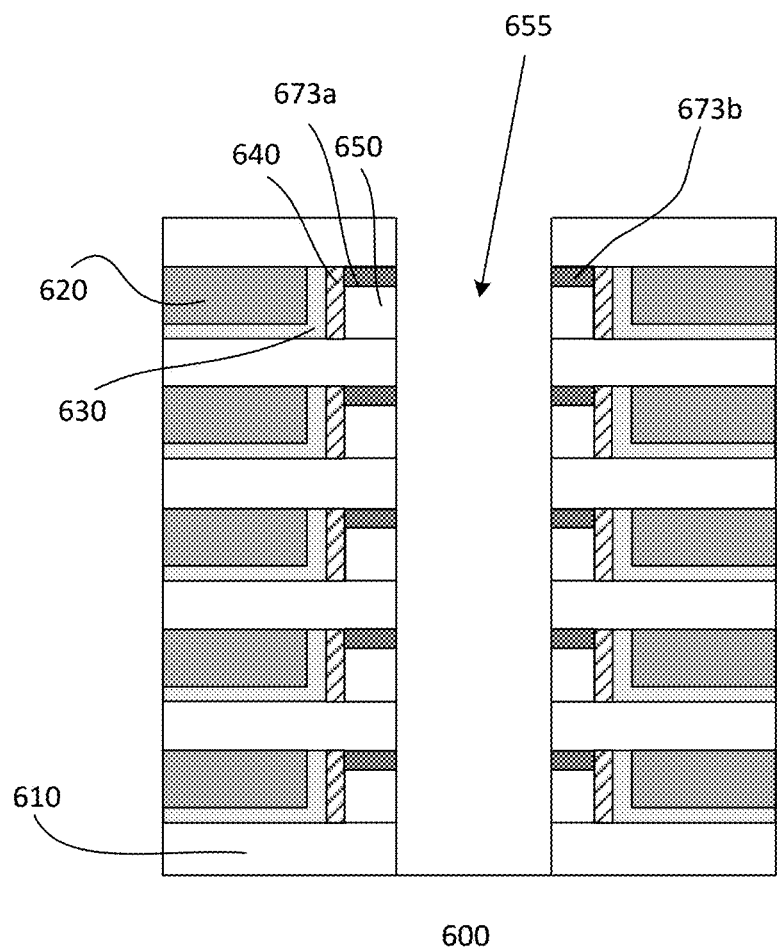

The process further forms a dielectric layer 615 over the first and second first type conductors 620a and 620b, the first and second memory elements 630 and 640, and the hard mask 673. The process steps as described in FIGS. 6a to 6f may be repeated until the desired numbers of cell stacks until a vertical structure such as that shown in FIG. 6g are formed. The process continues to form an opening 655 through a middle portion of the vertical structure and the ILD layer 610 as shown in FIG. 6h. The opening 655 is formed by suitable mask and etch techniques.

Figure 6I:
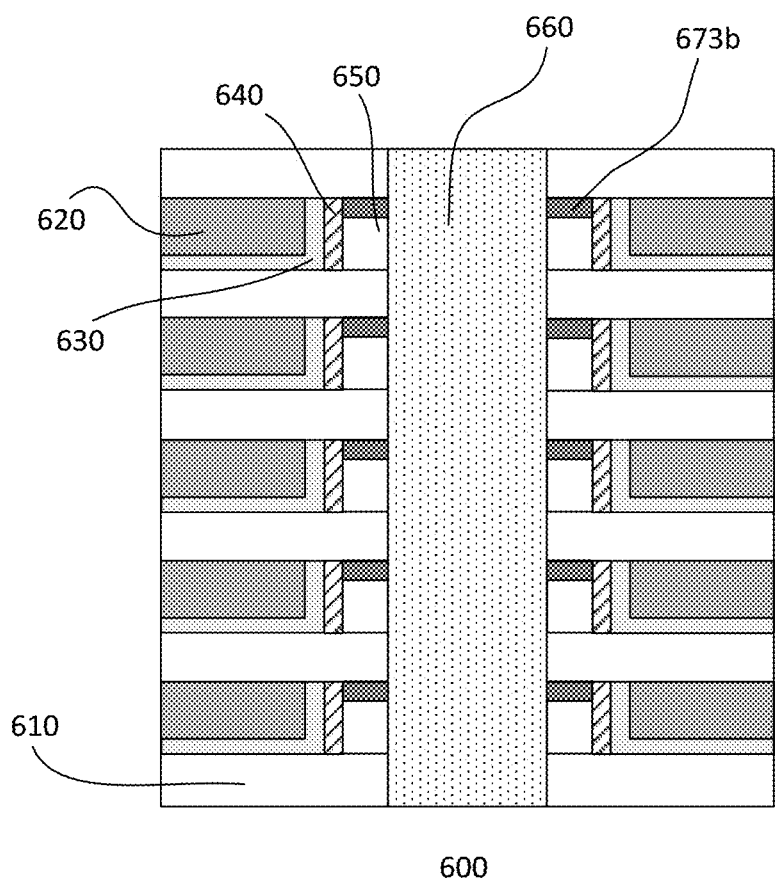

Referring to FIG. 6i, the process continues to fill the opening 655 with a conductor layer of a second polarity type 660, similar to that described in FIG. 5m. Other suitable techniques and dopant concentrations for the second polarity type dopants may also be useful. The conductor of the second polarity type 660 is coupled to a second type conductor (not shown). The second type conductor (not shown) for example, may be referred to as bit line. The bit line, for example, may be disposed at the bottom or top of the vertical structure. The process as described in FIGS. 6a-6i forms a device similar to that shown in FIG. 4b.

In one embodiment, the first polarity type is n-type while the second polarity type is p-type. Alternatively, the first polarity type is p-type while the second polarity type is n-type. In one embodiment, the first type conductor 620 is a word line while the second type conductor is a bit line. Alternatively, the first type conductor 620 is a bit line while the second type conductor is a word line.

As described, the first and second memory elements are RRAM. It is understood that other suitable types of memory elements may also be useful. For example, the memory element may be any type of memory element used in storing data, such as but are not limited to PCRAM, FeRAM and MRAM.

The process may continue to complete the memory device. For example, BEOL process including interconnect metal levels may be provided to form interconnections to the terminals of the memory cells and other circuit components, as desired. Other processes may also be included to complete the memory device, for example, final passivation, dicing and packaging.

As described, the memory device 600 may be similar or identical to the memory device 405. Thus, advantages provided by the memory device 405 are also applicable to the memory device 600.

Figure 7A:
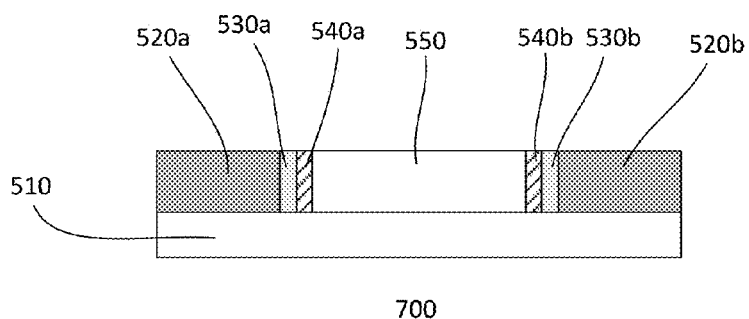
FIGS. 7a-7e show cross-sectional views of yet another embodiment of a process for manufacturing a memory device.

FIGS. 7a-7e show cross-sectional views of an embodiment of a process for manufacturing a memory device 700. The following description refers to FIGS. 7a-7e. In one embodiment, a partially processed structure such as that shown in FIG. 7a is provided. The partially processed structure is at the stage of processing as already described in FIG. 5j above. As such, common elements will not be described or described in detail. The process further forms a dielectric layer 515 over the first and second first type conductors 520a and 520b, the first and second memory elements 530 and 540, and the conductor layer of the first polarity type 550. The process steps as described in FIGS. 5a to 5j may be repeated until the desired numbers of cell stacks which form a vertical structure such as that shown in FIG. 7b which is similar to the vertical structure as described in FIG. 5k is formed.

Figure 7B:
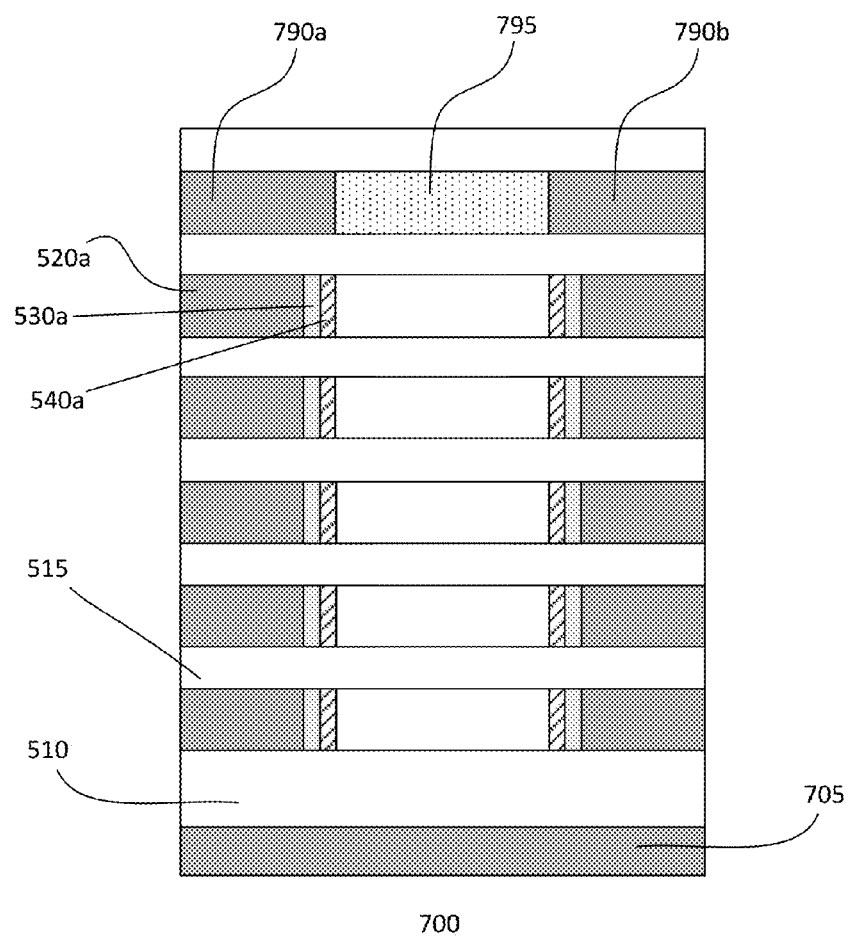

The process 700 also includes forming a select line stack on the vertical structure or between the vertical structure and the top most ILD layer 515 of the vertical structure. In one embodiment, the process forms the select line stack by: forming first and second select lines 790a and 790b on first and second sides of the vertical structure, respectively; and forming a conductor layer of a second polarity type 795 between the first and second select lines 790a and 790b as shown in FIG. 7b. The process steps for forming the select line stack are similar to that described in FIGS. 5a-5j, except that conductor layer of a second polarity type is formed instead of first polarity type and without forming the resistive layer and electrode.

Figure 7C:
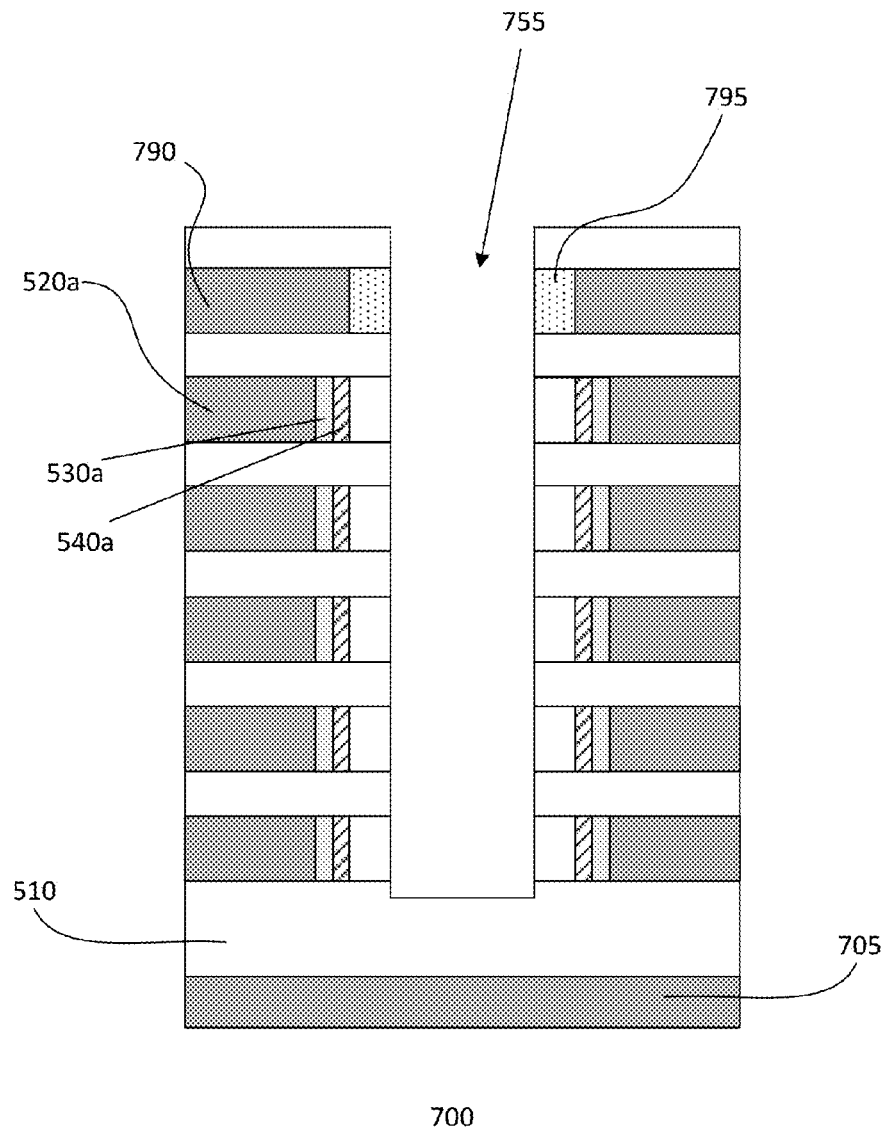
Figure 7D:
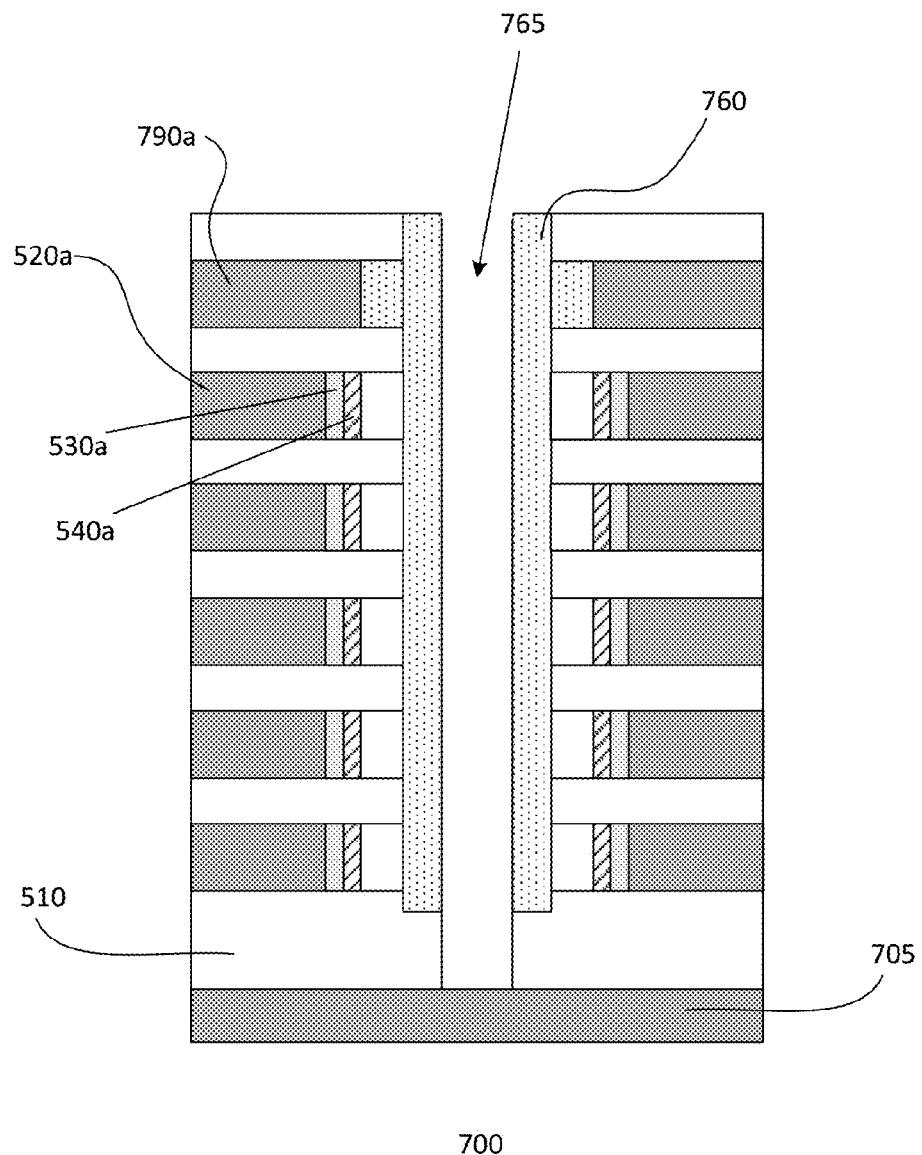
Figure 7E:
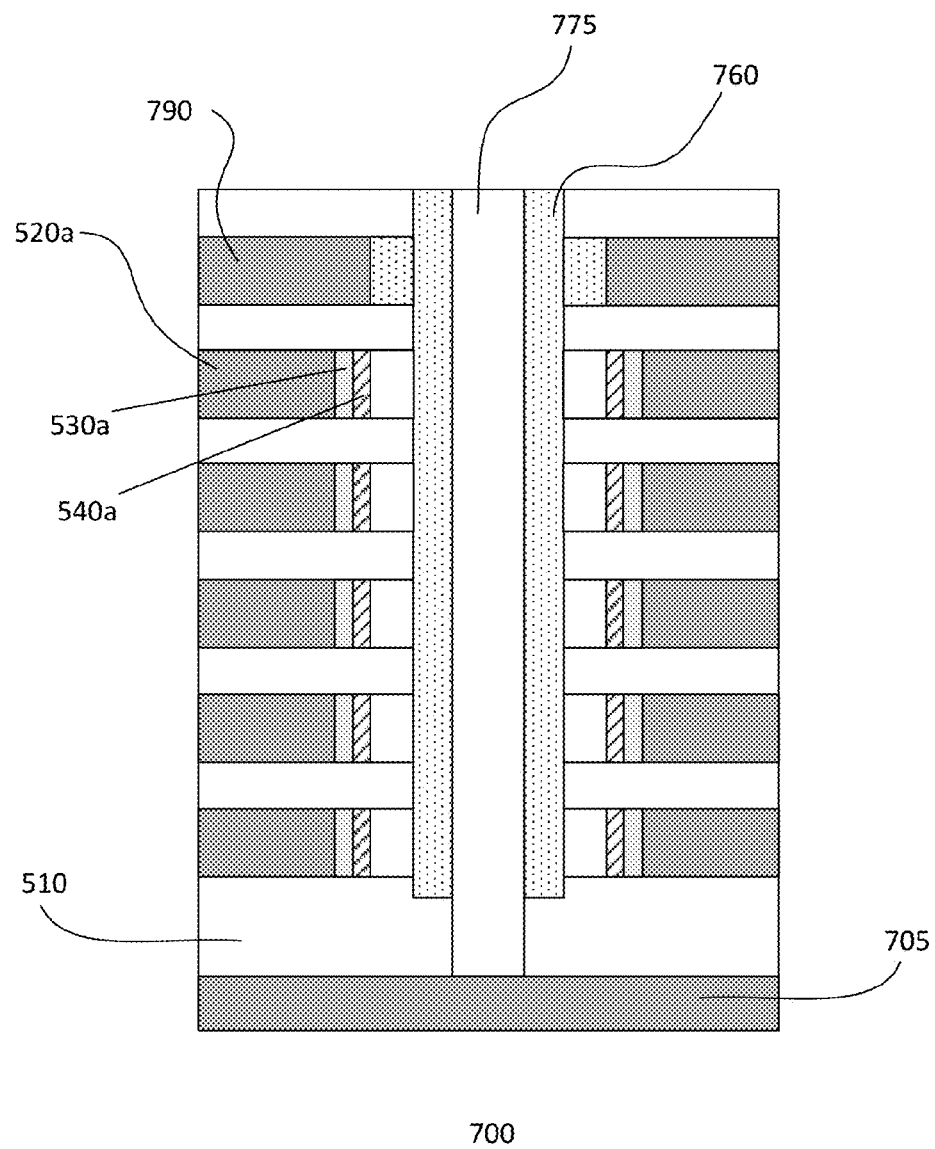

The process further includes: etching a first opening 755 through a middle portion of the select line stack and the vertical structure, where the first opening stops slightly below the top surface of the ILD layer 510 as shown in FIG. 7c; depositing a conductive layer of the second polarity type 760 as a liner layer, lining top surface of the top most ILD layer 515 over the select line stack and sidewalls of the opening 755. An anisotropic etch, such as RIE, may be performed to remove horizontal portions of the conductive layer of the second polarity type from the top surface of the top most ILD layer and bottom of the opening, leaving the liner layer of the second polarity type lining sides of the opening, and further etching the ILD layer 510 and stops at the bottom surface of the ILD layer 510 or top surface of a second type conductor as shown in FIG. 7d; and filling the opening 765 with a conductor layer of the first polarity type 775 as illustrated in FIG. 7e. A planarization process, such as CMP, may be performed to remove excess conductor layer of the first polarity type over the top surface of the top most ILD layer such that a substantially planar surface is formed as shown in FIG. 7e. The conductor layer of the first polarity type 775, in one embodiment, is coupled to the second type conductor 705 which is disposed below the ILD layer 510.

In one embodiment, the first polarity type is n-type while the second polarity type is p-type. Alternatively, the first polarity type is p-type while the second polarity type is n-type. In one embodiment, the first type conductor 520 is a word line while the second type conductor 705 is a bit line. Alternatively, the first type conductor 520 is a bit line while the second type conductor 705 is a word line.

As described, the first and second memory elements are RRAM. It is understood that other suitable types of memory elements may also be useful. For example, the memory element may be any type of memory element used in storing data, such as but are not limited to PCRAM, FeRAM and MRAM.

The process may continue to complete the memory device. For example, BEOL process including interconnect metal levels may be provided to form interconnections to the terminals of the memory cells and other circuit components, as desired. Other processes may also be included to complete the memory device, for example, final passivation, dicing and packaging.

The memory device 700 may be similar or identical to the memory device 200. Thus, advantages provided by the memory device 200 are also applicable to the memory device 700.

FIGS. 8a-8g show cross-sectional views of still another embodiment of a process for manufacturing a memory device 800. The following description refers to FIGS. 8a-8g. In one embodiment, the process includes: providing a substrate (not shown); forming an ILD layer 810 over the substrate (not shown); and forming, on the ILD layer 810, a vertical structure having one or more selector element stacks. In forming each of the one or more selector element stacks, the process includes: forming first and second first type conductor 820a and 820b on first and second sides of the selector element stack. The first and second first type conductors 820a and 820b are formed similar to that already described in FIG. 5d. In one embodiment, the first and second type conductors may be referred to as bit line.

Figure 8A:
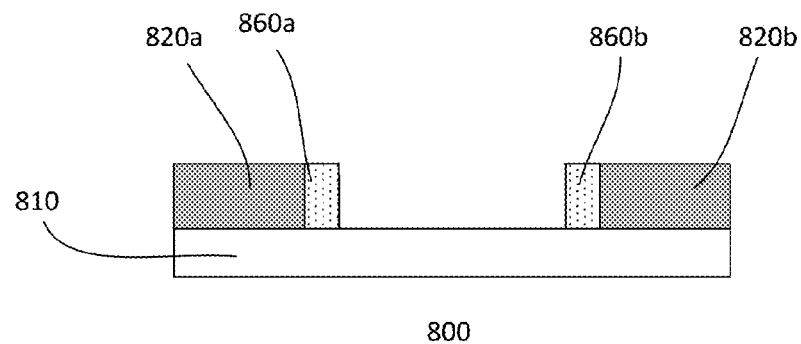
FIGS. 8a-8g show cross-sectional views of still another embodiment of a process for manufacturing a memory device.
Figure 8B:
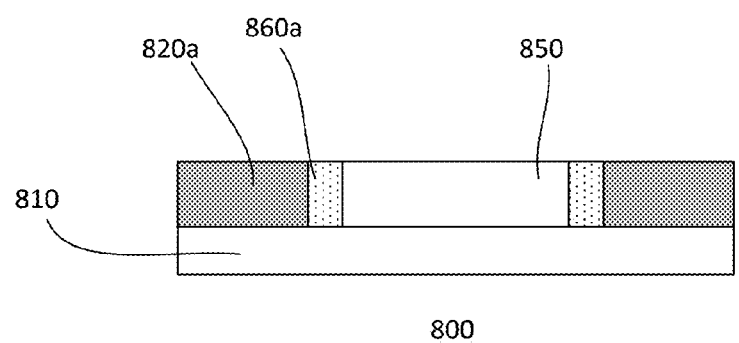

Referring to FIG. 8a, the process continues to form a conductor layer of a second polarity type 860 over the first type conductors 820a and 820b and lining the opening between the first type conductors. The process continues to remove horizontal portions of the conductor layer of the second polarity type over the first type conductors 820a and 820b and bottom of the opening, leaving first and second sections of the second conductor layer of the second polarity type 860a and 860b. The process also includes forming a conductor layer of a first polarity type 850 over the substrate and filling the opening between the first and second sections of the second conductor layer of the second polarity type 860a and 860b. Horizontal portions of the conductor layer of the first polarity type over the first type conductors 820a and 820b are removed until a partially processed structure such as that shown in FIG. 8b is formed. As shown, the first section of conductor layer of the second polarity type 860a is disposed between the first bit line 820a and the conductor layer of the first polarity type 850. The second section of conductor layer of the second polarity type 860b is disposed between the second bit line 820b and the conductor layer of the first polarity type 850.

Figure 8C:
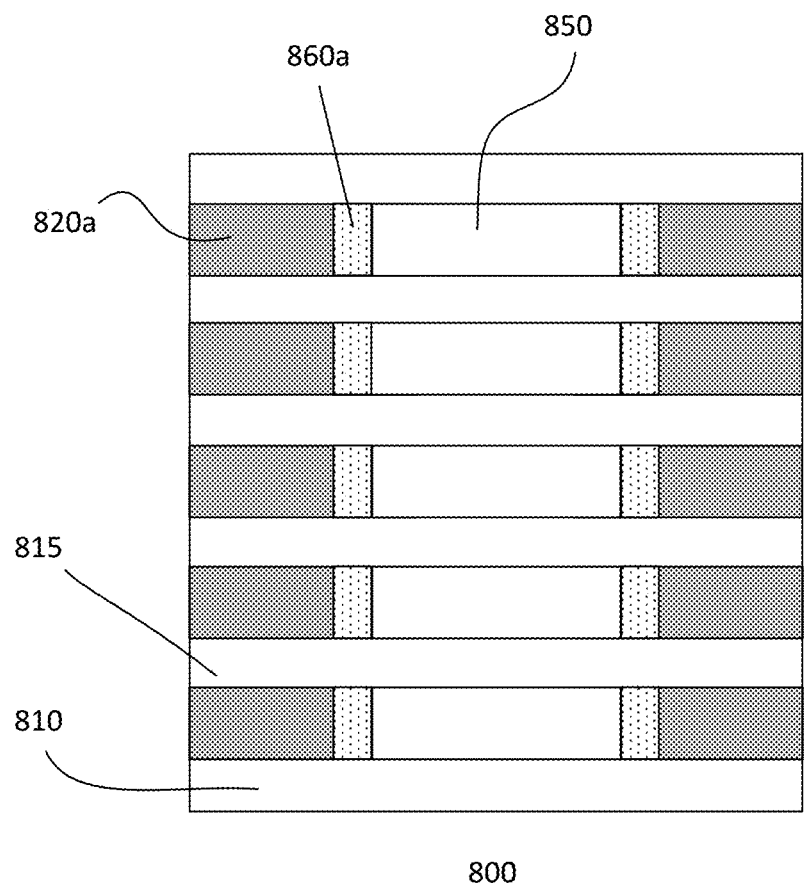

The process further forms a dielectric layer 815 over the first and second first type conductors 820a and 820b, the first and second sections of the conductor layer of the second polarity type 860a and 860b, and the conductor layer of the first polarity type 850. The process steps as described in FIGS. 8a-8b may be repeated until the desired numbers of selector element stacks which form a vertical structure such as that shown in FIG. 8c is formed.

Figure 8D:
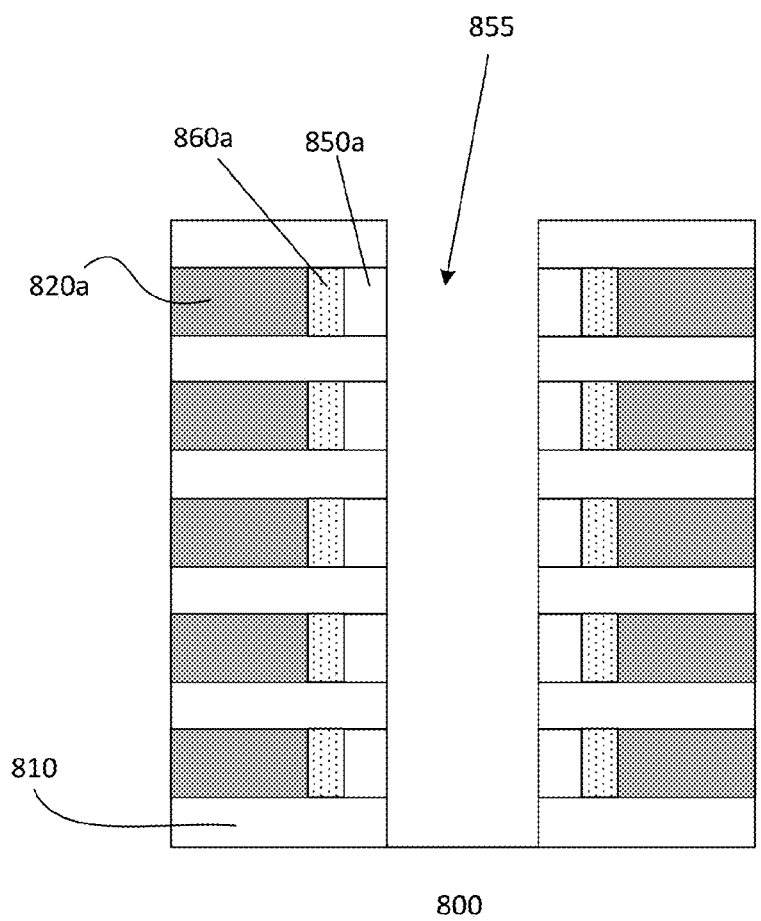
Figure 8E:
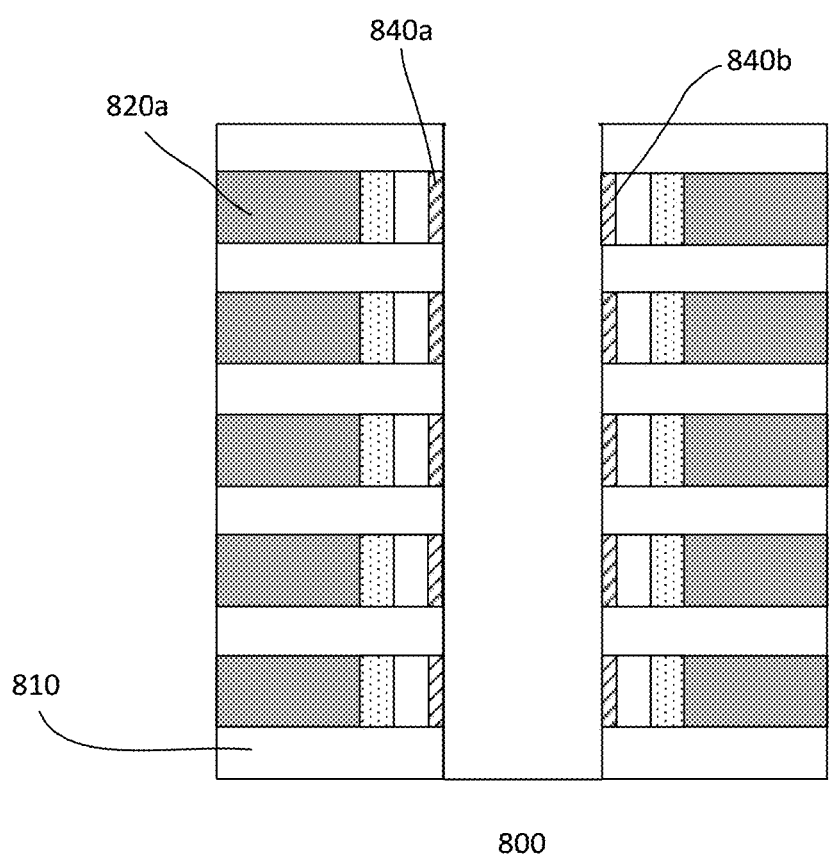
Figure 8F:
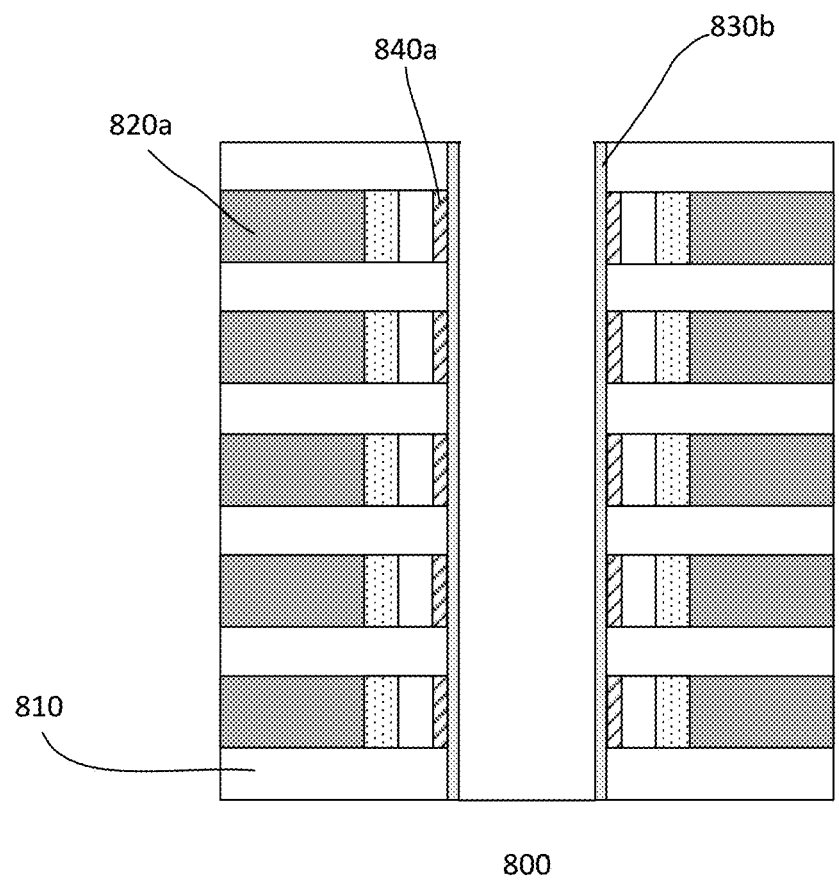
Figure 8G:
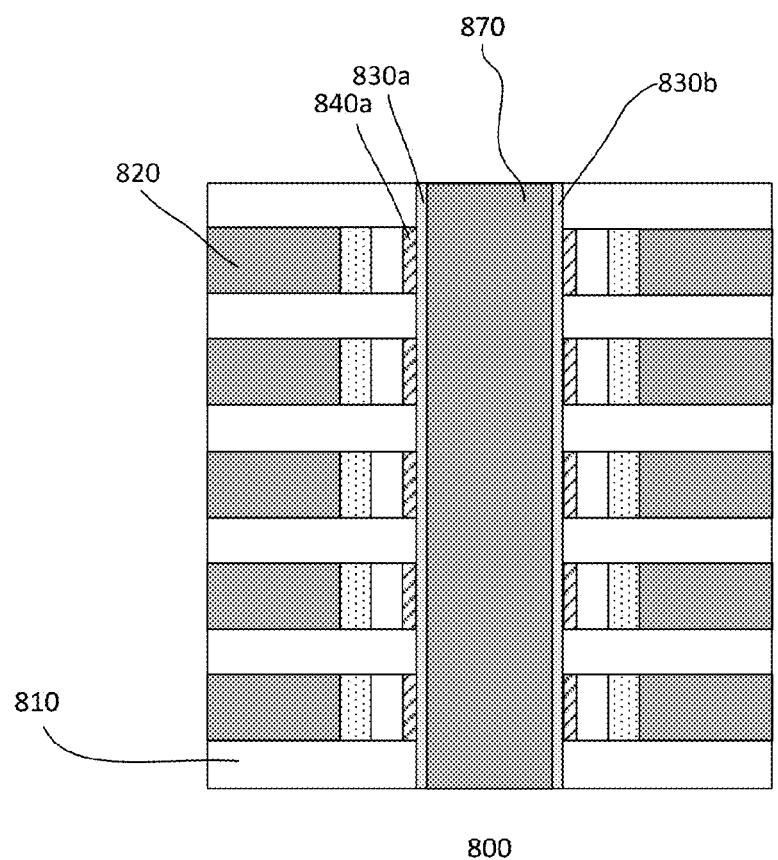

The process 800 also includes: etching an opening 855 through a middle portion of the vertical structure and first and second sections of the conductor layer of the first polarity type 850a and 850b are formed as shown in FIG. 8d; forming, for each of the one or more selector element stacks, first and second electrodes 840a and 840b as shown in FIG. 8e. The first and second electrodes 840a and 840b, for example, may include metal silicides formed by any suitable techniques. The process 800 also includes forming a first section of a resistive layer on a first sidewall of the opening as a first resistive layer 830a and a second section of the resistive layer on a second sidewall of the opening as a second resistive layer 830b as shown in FIG. 8f; and filling the opening 855 with a conductor or metal layer to form a second type conductor 870 as illustrated in FIG. 8g. The second type conductor 870, in one embodiment, may be referred to as word line. As shown in FIG. 8g, the first electrode 840a is between the first resistive layer 830a and the conductor layer of the first polarity type 850a of the respective selector element stack. The second electrode 840b is between the second resistive layer 830b and the conductor layer of the first polarity type 850b of the respective selector element stack.

In one embodiment, the first polarity type is n-type while the second polarity type is p-type. Alternatively, the first polarity type is p-type while the second polarity type is n-type. In one embodiment, the first type conductor 820 as described is a bit line while the second type conductor 870 is a word line. Alternatively, the first type conductor 820 is a word line while the second type conductor 870 is a bit line.

As described, the first and second memory elements are RRAM. It is understood that other suitable types of memory elements may also be useful. For example, the memory element may be any type of memory element used in storing data, such as but are not limited to PCRAM, FeRAM and MRAM.

The process may continue to complete the memory device. For example, BEOL process including interconnect metal levels may be provided to form interconnections to the terminals of the memory cells and other circuit components, as desired. Other processes may also be included to complete the memory device, for example, final passivation, dicing and packaging.

The memory device formed by process 800 may be similar or identical to the memory device 300. Thus, advantages provided by the memory device 300 are also applicable to the memory device 800.

The present disclosure may be embodied in other specific forms without departing from the spirit or essential characteristics thereof. The foregoing embodiments, therefore, are to be considered in all respects illustrative rather than limiting the present disclosure described herein. Scope of the present disclosure is thus indicated by the appended claims, rather than by the foregoing description, and all changes that come within the meaning and range of equivalency of the claims are intended to be embraced therein.

What is claimed is:

1. A method of manufacturing a device comprising:
   providing a substrate;
   forming an inter-layer dielectric (ILD) layer over the substrate;
   forming, on the ILD layer, a vertical structure having a plurality of memory with one or more selectors, the vertical structure is made of a plurality of conductive stacks, wherein a conductive stack of the plurality of conductive stacks is formed by
   (a) forming first and second first type conductors on first and second sides of the conductive stack,
   (b) providing a first memory element adjacent the first first type conductor and a second memory element adjacent the second first type conductor,
   (c) forming first and second electrodes with the first electrode adjacent the first memory element and the second electrode adjacent the second memory element,
   (d) forming a conductor layer of a first polarity type between the first and second first type conductors, and
   (e) forming a dielectric layer over the first and second first type conductors, the first and second electrodes, and the conductor layer of the first polarity type;
   forming and stacking a successive conductive stack by repeating steps (a)-(e) over a preceding conductive stack formed by steps (a)-(e) to form the vertical structure on the ILD layer;
   etching an opening through a middle portion of the plurality of conductive stacks which form the vertical structure and the ILD layer after forming the plurality of conductive stacks; and
   filling the opening with a conductor layer.

2. The method of claim 1 wherein providing the first and second memory elements comprises:

forming a first section of a memory layer in contact with the first first type conductor as the first memory element and a second section of the memory layer in contact with the second first type conductor as the second memory element; and wherein the conductor layer that fills the opening is of a second polarity type.

3. The method of claim 1 further comprising:

depositing a conductive layer of a second polarity type which lines top surface of the top most dielectric layer and sidewalls of the opening; and wherein filling the opening with a conductor layer comprises forming a second type conductor by filling the remaining opening with a metal.

4. The method of claim 3, wherein:

the first polarity type is n-type and the second polarity type is p-type; and the first type conductor comprises a word line and the second type conductor comprises a bit line.

5. The method of claim 1, wherein the first and second memory elements comprise resistive random-access memory (ReRAM).

6. The method of claim 1 wherein providing the first memory element adjacent the first first type conductor and the second memory element adjacent the second first type conductor comprises:

forming a first section of a memory layer in contact with the first first type conductor as the first memory element and a second section of the memory layer in contact with the second first type conductor as the second memory element; and further comprising forming a select line stack on the vertical structure or between the vertical structure and the ILD layer by forming first and second select lines on first and second sides of the vertical structure, respectively, and forming a conductor layer of a second polarity type between the first and second select lines;

etching an opening through a middle portion of the select line stack, wherein etching the opening through the middle portion of the select line stack is performed simultaneously with etching the opening though the middle portion of the plurality of conductive stacks which form the vertical structure;

depositing a conductive layer of a second polarity type which lines top surface of a dielectric layer over the select line stack and sidewalls of the opening; and wherein filling the opening with a conductor layer comprises filling the remaining opening with first polarity type conductor layer.

7. The method of claim 1 wherein providing the first and second memory elements comprises:

forming a first section of a memory layer in contact with the first first type conductor as the first memory element and a second section of the memory layer in contact with the second first type conductor as the second memory element.

8. The method of claim 7 wherein forming a conductive stack of the plurality of conductive stacks further comprises:

forming a first trench on a first side and a second trench on a second side of the ILD layer prior to forming the first and second first type conductors, wherein the first first type conductor is formed in the first trench and the second first type conductor is formed in the second trench; and removing a central portion of the ILD layer to form an opening in between the first type conductors.

9. The method of claim 8 wherein forming the first and second electrodes comprises:

providing an electrode layer over top surfaces of the first and second first type conductors and the first and second memory elements and lines the opening in between the first type conductors; and performing an etch to remove horizontal portions of the electrode layer from the top surfaces of the first type conductors and memory elements and bottom of the opening, wherein remaining electrode layer which lines a side of the first memory element forms the first electrode and remaining electrode layer which lines a side of the second memory element forms the second electrode.

10. The method of claim 9 wherein the conductor layer of the first polarity type is formed in remaining opening in between the first type conductors.

11. The method of claim 10 wherein:

etching the opening through the middle portion of the vertical structure passes through the conductor layer of the first polarity type, wherein etching the opening defines first and second sections of the conductor layer of the first polarity type; and the conductor layer that fills the opening is of a second polarity type.

12. The method of claim 11 wherein:

the first section of the conductor layer of the first polarity type and the conductor layer of the second polarity type form a first diode as the selector of the first memory element, while the second section of the conductor layer of the first polarity type and the conductor layer of the second polarity type form a second diode as the selector of the second memory element; and the first type conductors serve as wordlines.

13. The method of claim 7 wherein forming the conductor layer of the first polarity type is performed prior to forming the first type conductors, and wherein forming a conductive stack of the plurality of conductive stacks further comprises:

forming a hard mask layer on the conductor layer of the first polarity type; and forming trenches on first and second sides of the conductor layer of the first polarity type and hard mask layer, wherein the first and second first type conductors are formed in the trenches.

14. The method of claim 13 wherein providing the first and second memory elements comprises:

providing the memory layer in the trenches over the ILD, top surfaces of the first and second electrodes and top surface of the hard mask layer; and performing an etch to remove horizontal portions of the memory layer from the top surfaces of the hard mask layer and first and second electrodes, wherein the remaining memory layer which lines top surface of the ILD layer and a side of the first electrode forms the first memory element and the remaining memory layer which lines top surface of the ILD and a side of the second electrode forms the second memory element.

15. The method of claim 13 comprising:

etching the opening through the middle portion of the vertical structure passes through the hard mask layer and the conductor layer of the first polarity type, wherein etching the opening defines first and second sections of the conductor layer of the first polarity type; and the conductor layer that fills the opening is of a second polarity type.

16. The method of claim 1 wherein forming a conductive stack of the plurality of conductive stacks further comprises:

forming a first trench on a first side and a second trench on a second side of the ILD layer prior to forming the first and second first type conductors, wherein the first first type conductor is formed in the first trench and the second first type conductor is formed in the second trench; and removing a central portion of the ILD layer to form an opening in between the first type conductors.

17. The method of claim 16 wherein forming a conductive stack of the plurality of conductor stacks further comprises:

providing a conductor layer of a second polarity type over the first type conductors and lining the opening in between the first type conductors;

performing an etch to remove horizontal portions of the conductor layer of the second polarity type over the first type conductors and bottom of the opening, wherein the remaining conductor layer of the second polarity type forms a first section which is disposed between the first first type conductor and the conductor layer of the first polarity type and a second section which is disposed between the second first type conductor and the conductor of the first polarity type; and further comprising etching the opening through the middle portion of the vertical structure which passes through the conductor layer of the first polarity type, wherein etching the opening defines first and second sections of the conductor layer of the first polarity type.

18. The method of claim 17 wherein forming the first and second electrodes comprises performing a silicidation process to form metal silicides on exposed surfaces of the first and second sections of the conductor layer of the first polarity type, wherein the metal silicides correspond to the first and second electrodes.

19. The method of claim 17 wherein providing the first and second memory elements comprises:

forming a first section of a memory layer in contact with a first sidewall of the opening as the first memory element and a second section of the memory layer in contact with a second sidewall of the opening as the second memory element; and wherein filling the opening with a conductor layer comprises filling the remaining opening with a second type conductor.

20. The method of claim 19 wherein:

the first type conductors serve as bitlines;

the second type conductor serves as a wordline; and the first section of the conductor layer of the first polarity type and a first section of the conductor layer of the second polarity type form a first diode as the selector of the first memory element, while the second section of the conductor layer of the first polarity type and the second section of the conductor layer of the second polarity type form a second diode as the selector of the second memory element.

* * * * *